(12) United States Patent
Wikstroem et al.

(10) Patent No.: US 12,342,559 B2
(45) Date of Patent: Jun. 24, 2025

(54) TURN-OFF POWER SEMICONDUCTOR DEVICE WITH GATE RUNNERS

(71) Applicant: Hitachi Energy Ltd, Zürich (CH)

(72) Inventors: Tobias Wikstroem, Egliswil (CH); Thomas Stiasny, Wädenswil (CH); Paul Commin, Zürich (CH)

(73) Assignee: Hitachi Energy Ltd, Zürich (CH)

( * ) Notice: Subject to any disclaimer, the term of this patent is extended or adjusted under 35 U.S.C. 154(b) by 368 days.

(21) Appl. No.: 17/914,012

(22) PCT Filed: Mar. 31, 2021

(86) PCT No.: PCT/EP2021/058524
§ 371 (c)(1),
(2) Date: Sep. 23, 2022

(87) PCT Pub. No.: WO2021/198383
PCT Pub. Date: Oct. 7, 2021

(65) Prior Publication Data
US 2023/0136897 A1  May 4, 2023

(30) Foreign Application Priority Data
Mar. 31, 2020  (EP) .................................... 20167330

(51) Int. Cl.
*H10D 18/65*  (2025.01)
*H10D 62/10*  (2025.01)

(52) U.S. Cl.
CPC ........... *H10D 18/65* (2025.01); *H10D 62/127* (2025.01)

(58) Field of Classification Search
CPC ............... H01L 29/745; H01L 29/0684; H01L 29/0688; H01L 29/0692; H01L 29/0696;
(Continued)

(56) References Cited

U.S. PATENT DOCUMENTS

| 4,542,398 A | * | 9/1985 | Yatsuo | ............... | H01L 29/744 |
| | | | | | 257/E29.124 |
| 4,984,049 A | * | 1/1991 | Nishizawa | ............. | H01L 29/74 |
| | | | | | 257/E29.037 |

(Continued)

FOREIGN PATENT DOCUMENTS

| CN | 102214686 A | * | 10/2011 | ........... H01L 29/744 |
| CN | 104600101 A | | 5/2015 | |

(Continued)

OTHER PUBLICATIONS

Oikawa et al., Gate turn-off Thyristor, 1995, machine translation of JP H0760894, pp. 1-3. (Year: 1995).*
Chen et al., Power semiconductor component cathode image, 2013, machine translation of CN 102214686, pp. 1-8. (Year: 2013).*
Matsuyoshi et al., Gate turn-off Thyristor and Power convertor, 1993, machine translation of EP 0556739 A, pp. 1-14. (Year: 1993).*

*Primary Examiner* — Natalia A Gondarenko
(74) *Attorney, Agent, or Firm* — Slater Matsil, LLP

(57) ABSTRACT

A turn-off power semiconductor device includes first and second thyristor cells, a common gate contact and a plurality of stripe-shaped electrically conductive first gate runners. Each first gate runner has a first end portion, a second end portion opposite to the first end portion and a first connecting portion connecting the first end portion and the second end portion. The first end portion is directly connected to the common gate contact. The first gate electrode layer portions of all first thyristor cells are implemented as a first gate electrode layer. The second gate electrode layer portions of all second thyristor cells are implemented as a second gate electrode layer. The first gate electrode layer is directly connected to the common gate contact. At least the first connecting portion of each first gate runner is separated from the first gate electrode layer.

20 Claims, 13 Drawing Sheets

(58) Field of Classification Search
CPC ............. H01L 29/0804; H01L 29/1012; H01L 29/1016; H01L 29/74; H01L 29/7404; H01L 29/7412; H01L 29/744; H01L 29/747; H01L 29/6609; H01L 29/66121; H01L 29/66136; H01L 29/66204; H01L 29/66356; H01L 29/66363; H01L 29/66371; H01L 29/66386; H01L 27/0817; H01L 27/0921; H01L 27/1027; H01L 27/1028; H10D 18/00; H10D 18/021; H10D 18/211; H10D 18/221; H10D 18/60; H10D 18/65; H10D 18/80; H10D 62/102; H10D 62/103; H10D 62/108; H10D 62/117; H10D 62/123; H10D 62/124; H10D 62/125; H10D 62/126; H10D 62/127; H10D 62/133; H10D 62/135; H10D 62/141; H10D 62/142; H10D 62/145; H10D 62/148; H10D 62/192; H10D 62/199; H10D 62/206; H10D 64/20; H10D 64/233; H10D 64/232; H10D 64/27; H10D 64/291; H10D 12/021; H10D 12/211; H10D 12/441; H10D 84/0102; H10D 84/0105; H10D 84/131; H10D 84/136; H10D 84/138
USPC ......................................... 257/138; 357/38, 68
See application file for complete search history.

(56) References Cited

U.S. PATENT DOCUMENTS

| | | | |
|---|---|---|---|
| 5,021,855 A * | 6/1991 | Oikawa | ............... H01L 23/4824 |
| | | | 257/152 |
| 6,570,193 B1 | 5/2003 | Koga et al. | |
| 9,741,839 B1 | 8/2017 | Nakagawa | |
| 2016/0013302 A1 | 1/2016 | Rahimo et al. | |
| 2016/0284708 A1 | 9/2016 | Lophitis et al. | |
| 2017/0033208 A1 | 2/2017 | Ravener et al. | |
| 2017/0294435 A1 | 10/2017 | Rahimo et al. | |
| 2018/0204913 A1 | 7/2018 | Arnold et al. | |

FOREIGN PATENT DOCUMENTS

| | | | | |
|---|---|---|---|---|
| CN | 105226057 A | 1/2016 | | |
| CN | 106129111 A | 11/2016 | | |
| CN | 106537578 A | 3/2017 | | |
| CN | 108292669 A | 7/2018 | | |
| EP | 556739 A1 * | 8/1993 | ......... | H01L 29/1016 |
| EP | 0592991 A1 | 4/1994 | | |
| EP | 2930753 A1 | 10/2015 | | |
| JP | H04320374 A | 11/1992 | | |
| JP | 0760894 B2 * | 6/1995 | ........... | H01L 29/744 |
| JP | 2018503978 A | 2/2018 | | |
| WO | 2012041958 A2 | 4/2012 | | |

* cited by examiner

TURN-OFF POWER SEMICONDUCTOR DEVICE WITH GATE RUNNERS

CROSS-REFERENCE TO RELATED APPLICATIONS

This application is a national stage application of International Application No. PCT/EP2021/058524, filed on Mar. 31, 2021, which claims priority to European Patent Application No. 20167330.8, filed on Mar. 31, 2020, which applications are hereby incorporated herein by reference.

TECHNICAL FIELD

The present invention relates to a turn-off power semiconductor device comprising a plurality of thyristor cells which are all connected to a common gate contact.

BACKGROUND

In the field of power semiconductor devices there is known a turn-off power semiconductor device such as a gate commutated thyristor (GCT) power device, in particular an integrated gate commutated thyristor (IGCT). In a reverse conducting (RC) IGCT a freewheeling diode may be integrated in the device wafer.

As an example for a GCT power device a prior art RC-IGCT 1 is shown in FIGS. 1A and 1B. Such RC-IGCT is described, for example, in WO 2012/041958 A2. FIG. 1A illustrates a portion of the known RC-IGCT 1 in cross section and FIG. 1B shows the layout of the device in top view. The RC-IGCT 1 comprises a plurality of thyristor cells 2 and an integrated free-wheeling diode 3. All thyristor cells 2 and the integrated free-wheeling diode 3 are formed in one single wafer 10 having a first main side 11, which is the cathode side of the RC-IGCT 1, and a second main side 12, which is the anode side of the RC-IGCT 1.

As can be seen in FIG. 1A, each thyristor cell 2 comprises from the first main side 11 to the second main side 12 of the wafer 10 a first cathode electrode 21, an $n^+$-doped cathode semiconductor layer portion 22, a p-doped base semiconductor layer 23, an $n^-$-doped drift semiconductor layer 24, an n-doped buffer semiconductor layer 25, a $p^+$-doped first anode semiconductor layer 26 and a first anode electrode 27. The cathode semiconductor layer portions 22 of the plurality of thyristor cells 2 form a first cathode semiconductor layer. Therein the buffer semiconductor layer 25 has a rising doping concentration towards the second main side 12, whereas the drift semiconductor layer 24 has typically a constant doping concentration.

Further, each thyristor cell 2 has a gate electrode 20 which is arranged on the first main side 11 of the wafer 10 lateral to the cathode semiconductor layer portion 22 and contacting the base semiconductor layer 23, but separated from the first cathode electrode 21 and the cathode semiconductor layer portion 22. Therein, the term "lateral" relates to the position in a lateral direction which is a direction parallel to the first main side 11.

In the circumferential edge region of the wafer 10 there is arranged the integrated single free-wheeling diode 3, a cross section of which along the line AA' in FIG. 1B can also be seen in FIG. 1A. The free-wheeling diode 3 comprises from the first main side 11 to the second main side 12 of the wafer 10 a second anode electrode 31, a p-doped second anode semiconductor layer 32, an $n^+$-doped second cathode semiconductor layer 33, which is separated from the p-doped second anode semiconductor layer 32 by the $n^-$-doped drift semiconductor layer 24, and a second cathode electrode 34.

The arrangement of the plurality of thyristor cells 2 in the RC-IGCT 1 is illustrated in FIG. 1B which shows a top view onto the first main side 11 of the wafer 10. The cathode semiconductor layer portions 22 of the RC-IGCT 1 are formed in the shape of strips with its longitudinal direction aligned in a radial direction which is a direction extending from a lateral center of the circular wafer 10 and being parallel to the first main side 11 of the wafer 10. Further, strips shall be understood as layers, which have in one direction, which is their longitudinal direction, a longer extension than in the other directions by having two longer sides, which are typically arranged parallel to each other. The plurality of strip-shaped cathode semiconductor layer portions 22 are arranged in concentric rings around the center of the device. In the center region of the wafer 10 there is arranged a common gate contact 40 to which all gate electrodes 20 of the plurality of thyristor cells 2 are electrically connected. The gate electrodes 20 of the thyristor cells 2, the common gate contact 40 and the connections there between are implemented as a gate metallization layer surrounding all the cathode semiconductor layer portions 22.

For turning off the RC-IGCT, a short control gate current pulse is supplied through the common gate contact 40 to the gate electrodes 20 of the plurality of thyristor cells 2. The uniformity of the current distribution to the plurality of thyristor cells 2 is an important parameter for the turn-off performance of the RC-IGCT 1. In the RC-IGCT described above with FIGS. 1A and 1B, the common gate contact 40 is located on the first main side 11 in the center thereof. The thyristor cells 2 in an outer ring are turned off by a lower gate current than thyristor cells of an inner ring. Therefore the charge under the cathode semiconductor layer portions 22 of an inner ring is removed faster than that under the cathode semiconductor layer portions 22 of an outer ring. Accordingly, the thyristor cells 2 of an outer ring remain in an on-state longer and consequently can be overloaded, what may finally result in destruction of the whole device. The same problem of non-uniform turn-off of thyristor cells 2 due to an inhomogeneous gate current distribution exists not only for the RC-IGCT 1 but also for any other turn-off semiconductor power device comprising a plurality of thyristor cells.

To homogenize the current distribution it is known a turn-off power semiconductor device where the common gate contact has the shape of a concentric ring located on the first main side at the perimeter of the wafer. In another turn-off power semiconductor device as described in EP 0 592 991 A1, the common gate contact is located between two rings of thyristor cells somewhere between the center and the perimeter of the device. This known approaches have, however, the disadvantage that they can only alleviate the local inhomogeneities of the gate current pulse to the plurality of thyristor cells but cannot avoid them.

IGCT wafers normally do not display a linear relationship between the device area and the maximal controllable current, because of the unavoidable impedance increase in the gate circuit when the device area increases. A common approximation is that the controllable current scales linearly with the device diameter, or the square-root of the device area. For very large devices (>70 mm in diameter), this effect can become limiting in operation, because most other parameters scale linearly with the device area. For example, on-state losses and thermal resistance both scale down linearly with device area and would facilitate a linear increase of the current.

Increasing the device area leads to the distances over the wafer increasing as well. The distances translate into increased impedance within the gate metallization layer, both resistive and inductive. Consequently, the farthest region of the wafer, measuring from the gate contact, experience the highest impedance in the gate circuit. In addition, the closer regions of the gate metallization are loaded with higher gate current because the different regions of the gate metallization are normally connected in series.

From EP 2930753 A1 there is known a turn-off power semiconductor device comprising a plurality of thyristor cells, in which the distance between a gate electrode and a cathode semiconductor layer portion in a thyristor cell depends on the distance of the thyristor cell from a common gate contact. Specifically, for each pair of a first thyristor cell and a second thyristor cell of the plurality of thyristor cells, for which the distance between the first thyristor cell and the common gate contact is smaller than the distance between the second thyristor cell and the common gate contact, a minimum distance between the gate electrode and the cathode semiconductor layer portion is smaller in the second thyristor cell than in the first thyristor cell. The decreasing distance between gate electrode and the cathode semiconductor layer portion in a thyristor cell with increasing distance of the thyristor cells from the common gate contact results in a decreasing serial resistance of the base semiconductor layer connecting the gate electrode to the cathode semiconductor layer portion. In this way the decreased distance between the gate electrode and the cathode semiconductor layer portion with increasing distance of the thyristor cells from the common gate contact can compensate the increasing voltage drop with increasing distance from the common gate contact. However, while the inhomogeneities of the gate current density in the device can be avoided and the thyristor cells can be turned off at the same time to improve the turn-off performance of the turn-off power semiconductor device, at the same time increasing the distance between gate electrode and the cathode semiconductor layer portion in a thyristor cell increases the impedance which results in slower commutation of the conduction current from the cathode to the gate. Especially for large wafers this becomes a severe problem and this concept cannot be applied because the large impedance may prevent turn-off by commutation.

In CN 104600101 A it is disclosed an IGCT comprising a gate electrode layer that has two concentric rings separated by plural concentric rings of thyristor cells, wherein the two concentric rings of the gate electrode layer are connected to each other through radial gate electrode strips. It is, however, not disclosed any separation or decoupling of the radial gate electrode strips from the remaining gate electrode layer at its sides, so that the inductance distribution may still be unbalanced.

From U.S. Pat. No. 6,570,193 B1 it is known a reverse conducting thyristor device. It aims at preventing heat generated by power loss from filling end field protective rubber and at simplifying a sheath storing a semiconductor substrate. In a reverse conducting thyristor device according to this invention, a self-extinguishing thyristor region is arranged on an inner region of the semiconductor substrate, a reverse conducting diode region whose outer periphery is completely enclosed with an isolation region is arranged on its outer region by at least one, and an external takeout gate electrode region is further arranged on the outermost peripheral region of the semiconductor substrate on the outer part thereof. Thus, a gate electrode provided on a surface of a gate part layer of the self-extinguishing thyristor region is connected with an external takeout gate electrode formed along the outermost periphery of the substrate through a gate wiring pattern formed on a surface of a connecting region.

SUMMARY

Embodiments of the invention provide a turn-off power semiconductor device which allows to reliably control a large current.

In a first embodiment, a turn-off power semiconductor device comprises a semiconductor wafer having a first main side and a second main side opposite to the first main side, a plurality of thyristor cells, a common gate contact arranged on the first main side and a plurality of stripe-shaped electrically conductive first gate runners. Through-out the specification an element having a stripe-shaped shall mean an element that has along a longitudinal main axis thereof a length with is at least twice a length in any direction perpendicular to the longitudinal main axis. Each first gate runner has a first end portion, a second end portion opposite to the first end portion and a first connecting portion connecting the first end portion and the second end portion. The first end portion is directly connected to the common gate contact and a longitudinal main axis of each first gate runner is extending in a lateral direction away from the common gate contact. Each thyristor cell comprises in an order from the first main side to the second main side a first emitter layer portion of a first conductivity type, a first base layer portion of a second conductivity type different from the first conductivity type, a second base layer portion of the first conductivity type, and a second emitter layer portion of the second conductivity type. The first emitter layer portion is in direct contact with the first base layer portion to form a first p-n junction between the first base layer portion and the first emitter layer portion. The first base layer portion is in direct contact with the second base layer portion to form a second p-n junction between the first base layer portion and the second base layer portion. The second emitter layer portion is separated from the first base layer portion by the second base layer portion, wherein the second base layer portion is in direct contact with the second emitter layer portion to form a third p-n junction between the second base layer portion and the second emitter layer portion. Each thyristor cell further comprises a gate electrode layer portion which is arranged lateral to the first emitter layer portion and forms an ohmic contact with the first base layer portion, a first main electrode layer portion which is arranged on the first main side and forms an ohmic contact with the first emitter layer portion, and a second main electrode layer portion which is arranged on the second main side and forms an ohmic contact with the second emitter layer portion. The plurality of thyristor cells comprises first thyristor cells and second thyristor cells. The first emitter layer portion of each first thyristor cell has a distance from the common gate contact that is smaller than a predetermined distance. The first emitter layer portion of each second thyristor cell has a distance from the common gate contact that is larger than the predetermined distance. The distances shall be measured as a minimum lateral distance between the layers or contacts. The gate electrode layer portions of all first thyristor cells are implemented as a first gate electrode layer. The gate electrode layer portions of all second thyristor cells are implemented as a second gate electrode layer. The first gate electrode layer is directly connected to the common gate contact such that the gate electrode layer portion of each first thyristor cell is electrically connected to the common gate contact. The second end portion of each first gate runner is directly connected to the second gate electrode layer. At least the first connecting portion of each first gate runner is separated from the first gate electrode layer, so that any electrically conducting path from the first connecting portion of each first gate runner to the first gate electrode layer passes at least through one of the first end portion of the same first gate runner, the second end portion of the same first gate runner and the semiconductor wafer.

BRIEF DESCRIPTION OF THE DRAWINGS

Detailed embodiments will be explained below with reference to the accompanying figures in which.

The reference signs used in the figures and their meanings are summarized in the list of reference signs. Generally, similar elements have the same reference signs throughout the specification. The described embodiments are meant as examples and shall not limit the scope of the invention.

DETAILED DESCRIPTION OF ILLUSTRATIVE EMBODIMENTS

Figure 1A:
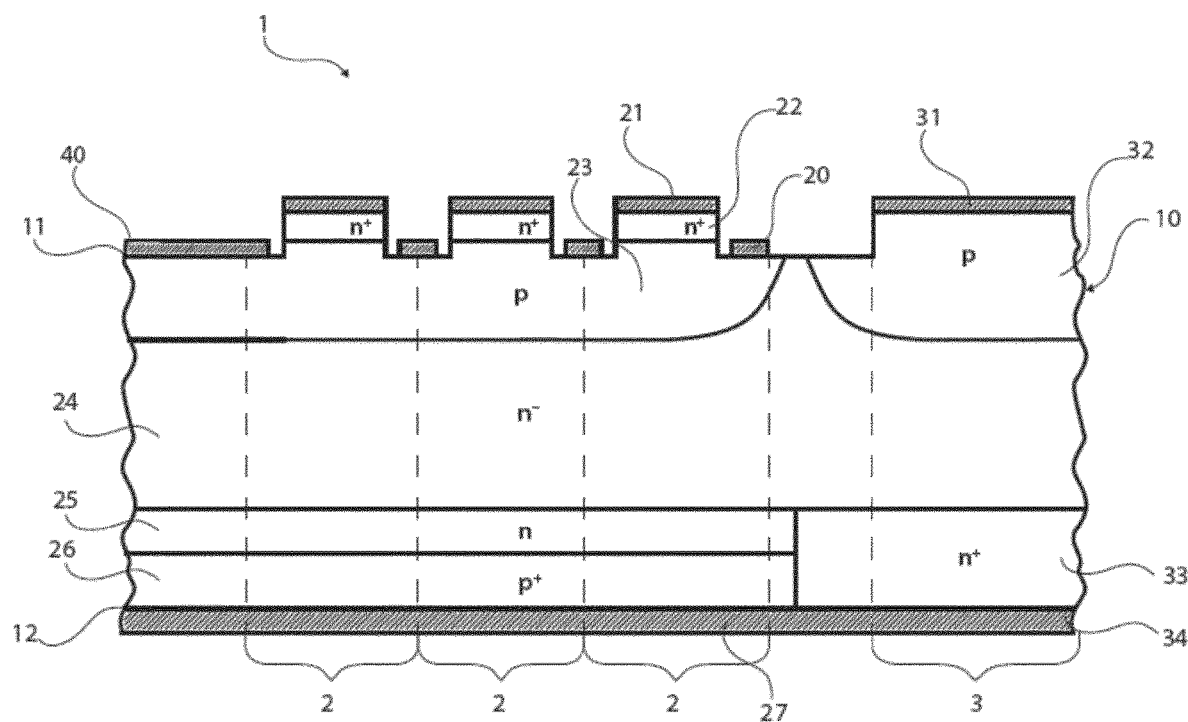
FIG. 1A is a cross-section of a turn-off power semiconductor device known from the prior art along a line A-A' in FIG. 1B.
Figure 1B:
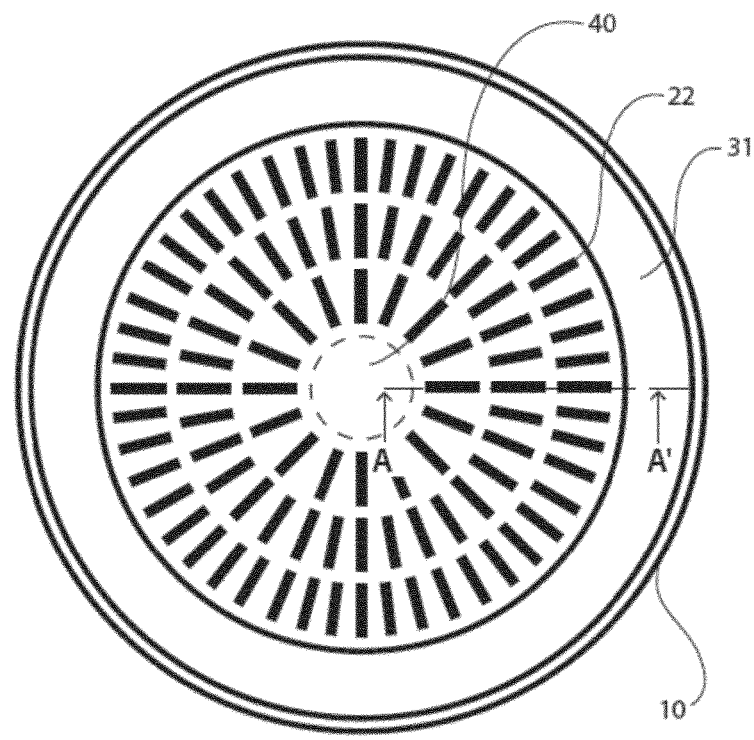
FIG. 1B is a top view of the turn-off power semiconductor device shown in FIG. 1A.

In one embodiment, a turn-off power semiconductor device comprises a semiconductor wafer 110 having a first main side in and a second main side 112 opposite to the first main side 111. A plurality of thyristor cells and a common gate contact 60 are arranged on the first main side 111. The wafer 110 also comprises a plurality of stripe-shaped electrically conductive first gate runners 70. Through-out the specification an element having a stripe-shaped shall mean an element that has along a longitudinal main axis thereof a length with is at least twice a length in any direction perpendicular to the longitudinal main axis.

Each first gate runner 70 has a first end portion 70a, a second end portion 70b opposite to the first end portion 70a and a first connecting portion 70c connecting the first end portion 70a and the second end portion 70b. The first end portion 70a is directly connected to the common gate contact 60 and a longitudinal main axis of each first gate runner 70 is extending in a lateral direction away from the common gate contact 60.

Each thyristor cell comprises in an order from the first main side 111 to the second main side 112 a first emitter layer portion 154a of a first conductivity type, a first base layer portion 155a of a second conductivity type different from the first conductivity type, a second base layer portion 159a of the first conductivity type, and a second emitter layer portion 158a of the second conductivity type. The first emitter layer portion 154a is in direct contact with the first base layer portion 155a to form a first p-n junction between the first base layer portion 155a and the first emitter layer portion 154a. The first base layer portion 155a is in direct contact with the second base layer portion 159a to form a second p-n junction between the first base layer portion 155a and the second base layer portion 159a. The second emitter layer portion 158a is separated from the first base layer portion 155a by the second base layer portion 159a, wherein the second base layer portion 159a is in direct contact with the second emitter layer portion 158a to form a third p-n junction between the second base layer portion 159a and the second emitter layer portion 158a.

Each thyristor cell further comprises a gate electrode layer portion which is arranged lateral to the first emitter layer portion 154a and forms an ohmic contact with the first base layer portion 155a, a first main electrode layer portion which is arranged on the first main side 111 and forms an ohmic contact with the first emitter layer portion 154a, and a second main electrode layer portion which is arranged on the second main side 112 and forms an ohmic contact with the second emitter layer portion 158a.

The plurality of thyristor cells comprises first thyristor cells 51 and second thyristor cells 52. The first emitter layer portion 154a of each first thyristor cell 51 has a distance from the common gate contact 60 that is smaller than a predetermined distance. The first emitter layer portion 154a of each second thyristor cell 52 has a distance from the common gate contact 60 that is larger than the predetermined distance. The distances shall be measured as a minimum lateral distance between the layers or contacts.

The gate electrode layer portions of all first thyristor cells 51 are implemented as a first gate electrode layer. The gate electrode layer portions of all second thyristor cells 52 are implemented as a second gate electrode layer. The first gate electrode layer is directly connected to the common gate contact 60 such that the gate electrode layer portion of each first thyristor cell 51 is electrically connected to the common gate contact 60. The second end portion 70b of each first gate runner 70 is directly connected to the second gate electrode layer. At least the first connecting portion 70c of each first gate runner 70 is separated from the first gate electrode layer, so that any electrically conducting path from the first connecting portion 70c of each first gate runner 70 to the first gate electrode layer passes at least through one of the first end portion 70a of the same first gate runner 70, the second end portion 70b of the same first gate runner 70 and the semiconductor wafer 110.

Throughout the specification, a lateral direction shall be understood as a direction parallel to the second main side 112. In case of an uneven second main side 112, a lateral direction parallel to the second main side 112 is to be understood as a direction parallel to a reference plane for which the arithmetic mean value of a distance between the second main side 112 and the reference plane is minimal (compared to all other planes), wherein the arithmetic mean value is calculated from the distance values of all points on the second main side 112. Throughout the specification the term lateral shall refer to such defined lateral direction. Exemplarily, if one element is described to be arranged lateral to another element, then it is arranged at a position which is shifted from the position of the other element in the lateral direction as defined above.

The first gate runners 70 in the turn-off power semiconductor device provide an efficient means for reducing the impedance of the electrical connection between the common gate contact 60 and the gate electrode layer portions of the second thyristor cells 52. Due to the separation of the connecting portion from the first gate electrode layer, the gate runners are not loaded with gate current for the first thyristor cells 51. This allows to turn off a current flowing through the second thyristor cells 52 by commutation efficiently even if the second thyristor cells 52 are far away from the common gate contact 60 so that the turn-off power semiconductor device of the invention can be implemented with a large device area to thereby achieve a reliable control of a relatively large current.

The common gate contact 60 is ring-shaped in an orthogonal projection onto a plane parallel to the second main side 112 and the longitudinal main axis of each first gate runner 70 extends in a radial direction from the common gate contact 60 towards a lateral center C of the semiconductor wafer 110. In this arrangement the gate control is especially efficient because a relatively large device area at the circumferential edge of the semiconductor wafer 110 has a small distance to the common gate contact 60, while only a relatively small device area in the lateral center C region of the semiconductor wafer 110 has a relatively large distance to the common gate contact 60, wherein the thyristor cells in the central region of the semiconductor wafer 110 are connected to the common gate contact 60 through the first gate runners 70.

In an orthogonal projection onto a plane parallel to the second main side 112, a first ring shaped gate electrode layer portion 171b of the second gate electrode layer is arranged inside the ring-shaped common gate contact 60 to laterally surround the remaining portion of the second gate electrode layer, wherein each first gate runner 70 connects the common gate contact 60 with the first ring-shaped electrode layer portion 171b. This arrangement allows most efficient gate control of the second thyristor cells 52.

Also, the first ring-shaped gate electrode layer portion is separated from the first gate electrode layer so that any electrically conducting path from the second gate electrode layer passes at least through the semiconductor wafer 110 or through one of the first gate runners 70. Accordingly, an electrical path for the gate current for the first thyristor cells 51 is most efficiently decoupled from an electrical path for the gate current for the second thyristor cells 52.

In an exemplary embodiment each one of the first gate electrode layer, the second gate electrode layer, the common gate contact 60 and the first gate runners 70 comprise a metal material. The metal material has a significantly larger electrical conductivity than the semiconductor material so that the impedance of any electrical path from the common gate contact 60 to any gate electrode layer portion is relatively low.

In an exemplary embodiment, the plurality of thyristor cells comprise third thyristor cells 53, wherein the first emitter layer portion 154a of each third thyristor cell 53 has a distance from a common gate contact 60 that is greater than a distance of each one of the first emitter layer portions 154a of the first thyristor cells 51 and greater than a distance of each one of the second thyristor cells 52 from the common gate contact 60. The gate electrode layer portions of all third thyristor cells 53 are implemented as a third gate electrode layer. A second ring-shaped gate electrode layer portion of the third gate electrode layer is arranged inside of the ring-shaped common gate contact 60 to laterally surround the remaining portion of the third gate electrode layer. The first gate electrode layer and the second gate electrode layer are both arranged outside of the second ring-shaped gate electrode layer portion.

The turn-off power semiconductor device according to this exemplary embodiment further comprises a plurality of stripe-shaped electrically conductive second gate runners, each second gate runner having a third end portion, a fourth end portion opposite to the third end portion and a second connecting portion connecting the third end portion and the fourth end portion. The third end portion of each second gate runner is connected to the first ring-shaped electrode layer portion and the fourth end portion of each second gate runner is connected to the second ring-shaped electrode layer portion.

At least the second connecting portion of each second gate runner is separated from the second gate electrode so that any electrically conducting path from the second connecting portion of each second gate runner to the second gate electrode layer passes at least through one of the third end portion of the same second gate runner, the fourth end portion of the same second gate runner and the semiconductor wafer 110. In this exemplary embodiment the gate control of second thyristor cells 52 is facilitated by the first gate runners 70 and the gate control of the third thyristor cells 53 is facilitated by the first and second gate runners.

In the latter exemplary embodiment, the number of first gate runners 70 may be higher than the number of second gate runners. In this manner inhomogeneities of the gate current density in the device can be avoided and the first, second and third thyristor cells 53 can be turned off at the same time to improve the turn-off performance of the turn-off semiconductor device.

A longitudinal main axis of each second gate runner may be aligned with the longitudinal main axis of one of the first gate runners 70. In this manner the impedance of an electrical path from the gate electrode portions of third thyristor cells 53 to the common gate contact 60 can be further reduced.

In an exemplary embodiment, the semiconductor wafer 110 has a circular shape in an orthogonal projection onto a plane parallel to the second main side 112. Also, in the orthogonal projection the first emitter layer portions 154a of the plurality of thyristor cells are stripe-shaped and are arranged in concentric rings with a longitudinal main axis of the stripe-shaped first emitter layer portions 154a respectively extending along a radial direction extending from a lateral center C of the semiconductor wafer 110, wherein in each ring all first emitter layer portions 154a have the same distance from the lateral center C. In this exemplary embodiment efficient gate control of all thyristor cells is facilitated.

In an exemplary embodiment, a length of the first emitter layer portions 154a in an innermost ring varies as a function of a distance to the next first gate runner 70 (along the innermost ring, i.e., along a line extending in a direction perpendicular to the radial direction), such that any first emitter layer portion 154a adjacent to anyone of the first gate runners 70 has a shorter length than all other first emitter portions in this innermost ring which are not adjacent to one of a first gate runners 70. Such arrangement allows to further reduce the impedance of an electrical path from the gate electrode layer portions of second thyristor cells 52 to the common gate contact 60. Therein, the next first gate runner 70 is that first gate runner 70 of the plurality of stripe-shaped electrically conductive first gate runners 70 which has the minimal distance to the respective first emitter layer portion 154a.

Throughout the specification, if there is a plurality of first elements, a first element next to a second element ("next first element") means that first element of the plurality of first elements that has the minimal distance to the second element. Also, if there is a plurality of first elements, a first element adjacent to a second element ("adjacent first element') means that there is no other first element between the adjacent first element and the second element.

In the later exemplary embodiment, the length of the first emitter layer portions 154a in the innermost ring may increase with increasing distance from the next first gate runner 70 such that a distance of the first emitter layer portions 154a in the innermost ring to the respective next first emitter layer portion 154a of a second thyristor cell 52 increases with increasing distance to the next first gate runner 70.

In an exemplary embodiment, a length of each first gate runner 70 in a radial direction is at least two or at least three times a maximal length of the first emitter layer portions 154a of any first thyristor cell 51.

In an exemplary embodiment, a thickness of each first gate runner 70 in a direction perpendicular to the lateral direction is at least 25% higher or at least 50% higher than a thickness of the first gate electrode layer at a position in the middle between two adjacent first emitter layer portions 154a, wherein a thickness direction is a direction perpendicular to the second main side 112. This may further reduce the impedance of the first gate runners 70 to further improve gate control of the second thyristor cells 52, while the relatively thin first gate electrode layer allows small distances between neighboring first emitter layer portions 154a of the first thyristor cells 51.

In an exemplary embodiment, the first gate runner 70 is separated and electrically insulated from the semiconductor wafer 110 by an insulating layer interposed between the first gate runner 70 and the semiconductor wafer 110. Such electrical insulation of the first gate runners 70 from the semiconductor wafer 110 further facilitates gate control of the second thyristor cells 52.

In an exemplary embodiment, the first and/or second gate runners are laterally arranged with rotational symmetry. Such arrangement may reduce the inhomogeneities of the gate current density in the device and the thyristor cells can be turned off at the same time to improve the turn-off performance of the turn-off power semiconductor device.

The third, fifth and sixth embodiments are embodiments of the claimed inventions. The first, second and fourth embodiment as shown in FIGS. 2A-2D, 3, and 5A-5D do as such not fall under the scope of the claims, but serve for a better understanding of certain aspects of the invention.

Figure 2A:
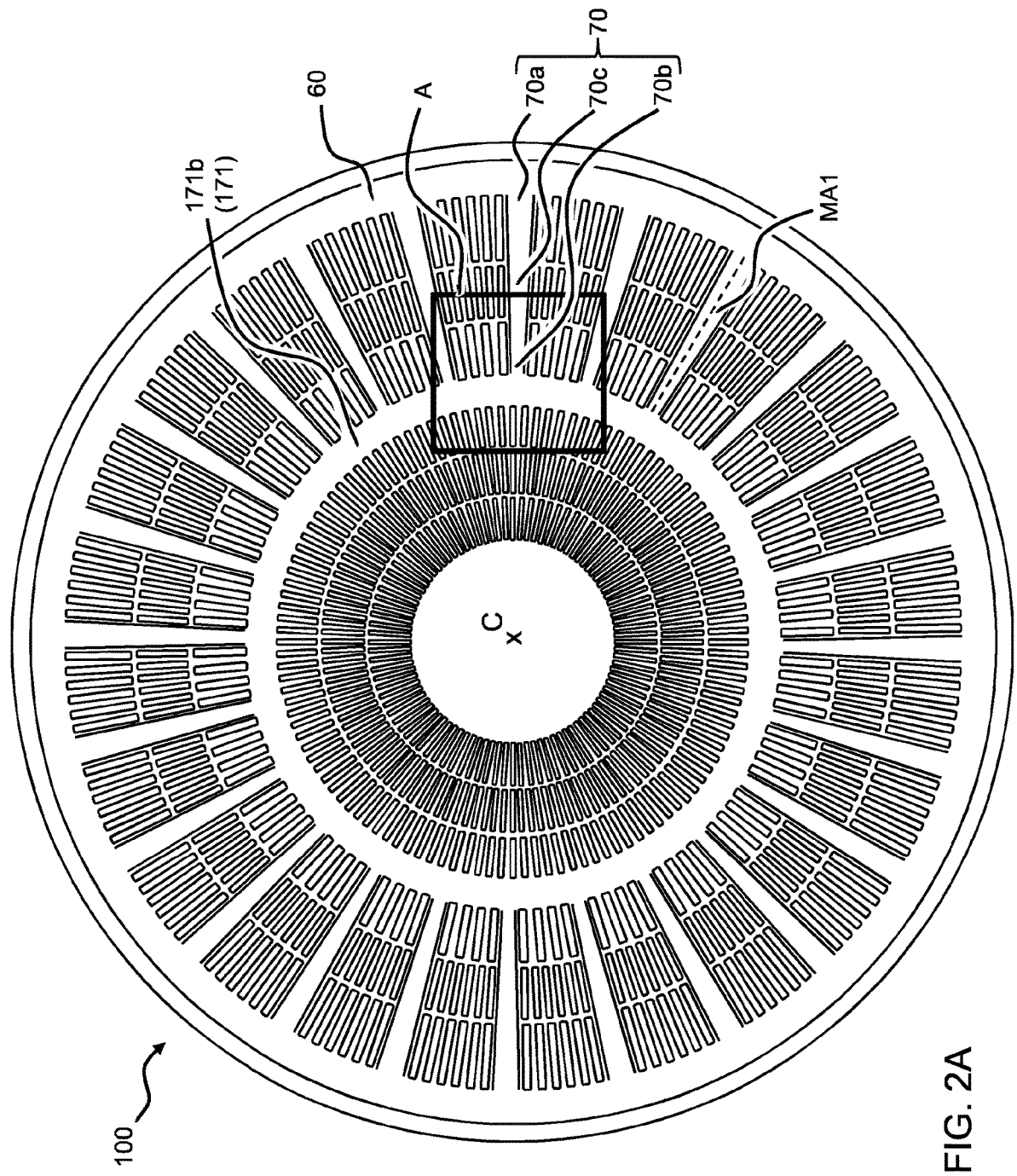
FIG. 2A shows a top view of a turn-off power semiconductor device according to a first embodiment (which does as such not fall under the scope of the claims, but serves for a better understanding of certain aspects of the claimed invention)
Figure 2B:
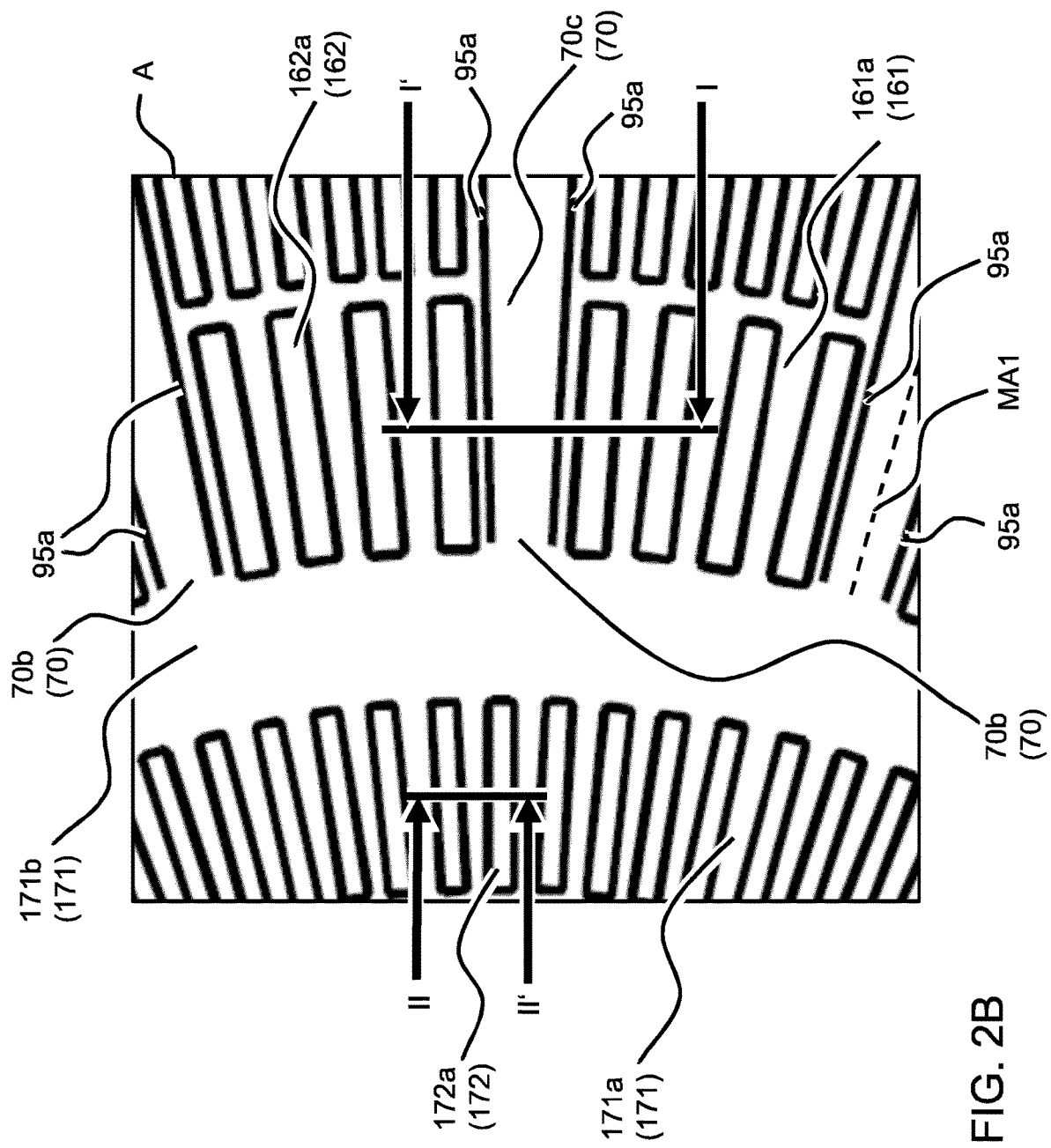
FIG. 2B shows an enlarged view of section A in the top view of FIG. 2A.
Figure 2C:
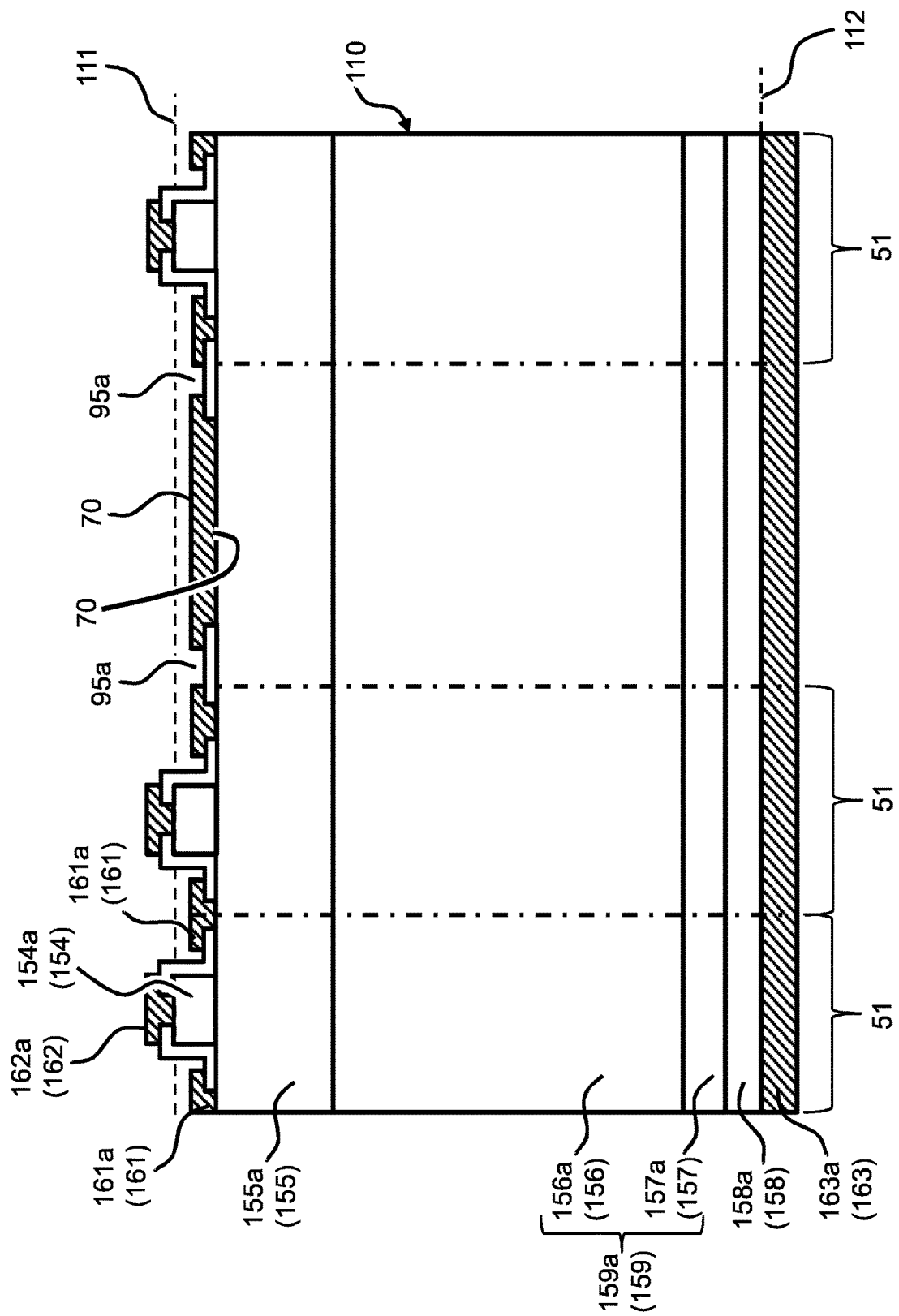
FIG. 2C is a cross-section of the turn-off power semiconductor device of FIG. 2A along a line I-I' in FIG. 2B.
Figure 2D:
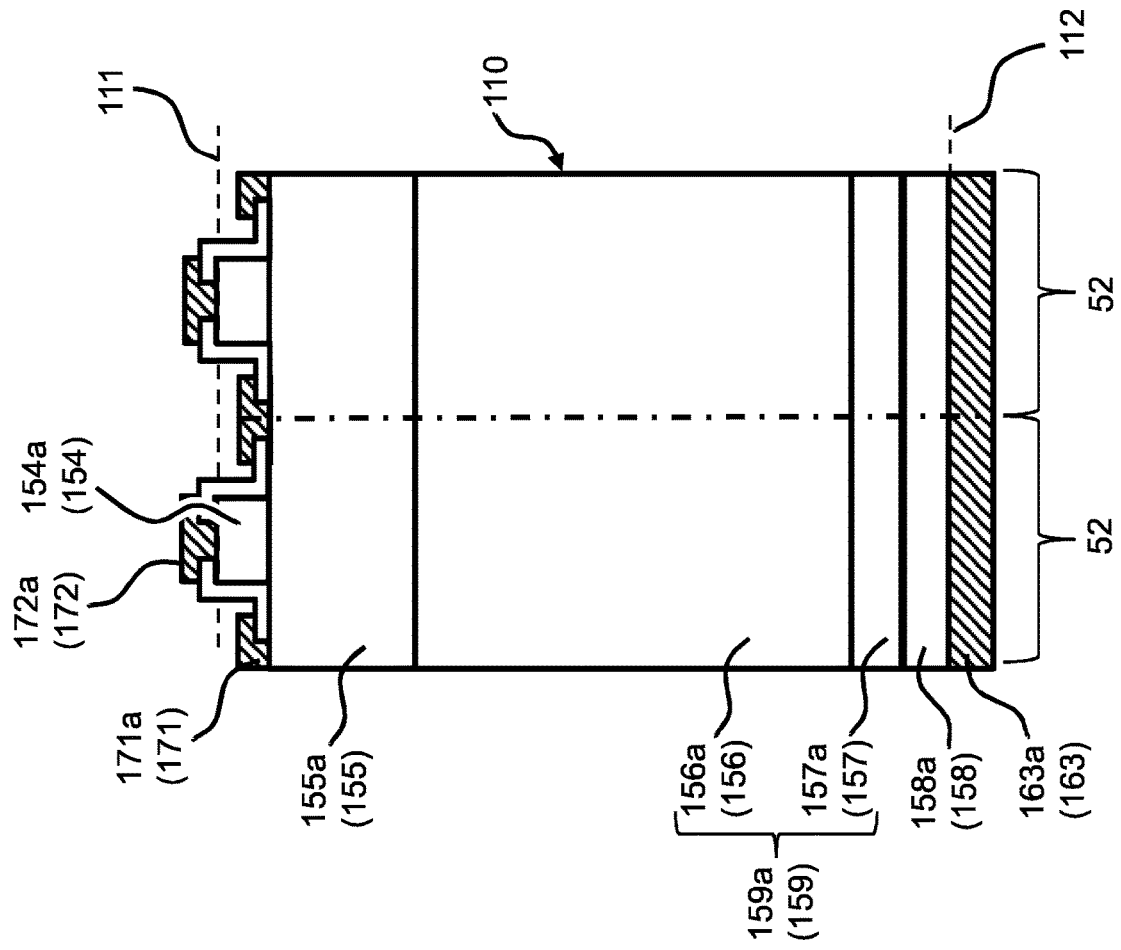
FIG. 2D is a cross-section of the turn-off power semiconductor device of FIG. 2A along a line II-II' in FIG. 2B.

In the following a turn-off power semiconductor device 100 according to a first embodiment is described with reference to FIGS. 2A, 2B, 2C and 2D. FIG. 2A illustrates the turn-off power semiconductor device 100 in top view, FIG. 2B shows an enlarged view of section A in FIG. 2A, FIG. 2C shows a vertical cross section of the turn-off power semiconductor device 100 along a line I-I' in FIG. 2B, and FIG. 2D shows a vertical cross section of the turn-off power semiconductor device 100 along a line II-II' in FIG. 2B.

The turn-off power semiconductor device 100 comprises a semiconductor wafer 110 having a first main side 11 and a second main side 112 opposite to the first main side 11. The first main side 11 and the second main side 112 of the semiconductor wafer 110 shall respectively be understood as a plane including the outermost flat surface portions of the semiconductor wafer 110 on two opposite sides. Integrated in the semiconductor wafer 110 is a plurality of thyristor cells 51, 52 comprising first thyristor cells 51 and second thyristor cells 52.

Each of the first thyristor cells 51 comprises in an order from the first main side in to the second main side 112 an $n^+$-type first emitter layer portion 154a, a p-type first base layer portion 155a, an n-type second base layer portion 159a, and a $p^+$-type second emitter layer portion 158a. The first emitter layer portion 154a is in direct contact with the first base layer portion 155a to form a first p-n junction between the first base layer portion 155a and the first emitter layer portion 154a. The first base layer portion 155a is in direct contact with the second base layer portion 159a to form a second p-n junction between the first base layer portion 155a and the second base layer portion 159a, and the second emitter layer portion 158a is separated from the first base layer portion 155a by the second base layer portion 159a. The second base layer portion 159a is in direct contact with the second emitter layer portion 158a to form a third p-n junction between the second base layer portion 159a and the second emitter layer portion 158a. Therein, the second base layer portion 159a may comprise a drift layer portion 156a and a buffer layer portion 157a separating the second emitter layer portion 158a from the drift layer portion 156a. The buffer layer portion 157a has a higher doping concentration than the drift layer portion 156a. It may have a rising doping concentration towards the second main side 112, whereas the drift layer portion 156a may have a constant doping concentration. Each first thyristor cell 51 further comprises a first gate electrode layer portion 161a, a first main electrode layer portion 162a and a second main electrode layer portion 163a. The first gate electrode layer portion 161a is arranged lateral to the first emitter layer portion 154a and forms an ohmic contact with the first base layer portion 155a. The first main electrode layer portion 162a is arranged on the first main side 111 and forms an ohmic contact with the first emitter layer portion 154a. The second main electrode layer portion 163a is arranged on the second main side 112 and forms an ohmic contact with the second emitter layer portion 158a. The first gate electrode layer portions 161a of all first thyristor cells 51 are implemented as a first gate electrode layer 161.

The second thyristor cells 52 have basically the same structure as the first thyristor cells 51. FIG. 2D shows the structure of two second thyristor cells 52 in cross section. Same reference signs therein refer to elements that have the same features and characteristics as described above for the first thyristor cells 51. Accordingly, it is referred to the description of the first thyristor cells 51 above. Second gate electrode layer portions 171a of the second thyristor cells 52 are arranged lateral to the first emitter layer portions 154a of the second thyristor cells 52 and form an ohmic contact with the first base layer portions 155a, respectively. The second gate electrode layer portions 171a of all second thyristor cells 52 are implemented as a second gate electrode layer 171.

The first thyristor cells 51 are arranged in three concentric rings in a plane parallel to the second main side 112 and adjacent to a circumferential edge of the semiconductor wafer 110. Accordingly, in the top view in FIG. 2A the first main electrode layer portions 162a of the first thyristor cells 51 are arranged in three concentric rings and a white area surrounding the first main electrode layer portions 162a of the first thyristor cells 51 corresponds to the first gate electrode layer 161 laterally surrounding the first main electrode layer portions 162a of all first thyristor cells 51.

The second thyristor cells 52 are arranged in three concentric rings in a plane parallel to the second main side 112 and in a central region of the semiconductor wafer 110. In the top view of FIG. 2A the three concentric rings of first thyristor cells 51 surround the three concentric rings of second thyristor cells 52. In the top view in FIG. 2A first main electrode layer portions 172a of the second thyristor cells 52 are arranged in three concentric rings and are surrounded by the second gate electrode layer 171. Specifically, in an orthogonal projection onto a plane parallel to the second main side 112, the semiconductor wafer 110 has a circular shape, the first emitter layer portions 154a of the plurality of thyristor cells (i.e., of the first thyristor cells 51 and of the second thyristor cells 52) are stripe-shaped and are arranged in concentric rings with a longitudinal main axis of the stripe-shaped first emitter layer portions 154a respectively extending along a radial direction extending from a lateral center C of the semiconductor wafer 110.

A common gate contact 60 is arranged on the first main side 111. In the top view of FIG. 2A the common gate contact 60 has a ring-shape and extends along the circumferential edge of the semiconductor wafer 110. In each concentric ring in which the emitter layer portions 154a are arranged, all first emitter layer portions 154a have the same distance from the common gate contact 60.

The first emitter layer portion 154a of each first thyristor cell 51 has a distance from the common gate contact 60 that is smaller than a predetermined distance, and the first emitter layer portion of each second thyristor cell 52 has a distance from the common gate contact 60 that is larger than the predetermined distance. That means that all first emitter layer portions 154a of all first thyristor cells 51 have a smaller distance from the common gate contact 60 than any first emitter layer portion 154a of each second thyristor cell 52.

The first gate electrode layer 161 is directly connected to the common gate contact 60 such that the first gate electrode layer portion 161a of each first thyristor cell 51 is electrically connected to the common gate contact 60 by an electrical path inside of the first gate electrode layer 161.

A plurality of stripe-shaped, electrically conductive first gate runners 70 is arranged on the semiconductor wafer 110 at the first main side 11. In FIG. 2A the first gate runners 70 can be seen in top view, whereas in FIG. 2C a first gate runner 70 is shown in cross section. Each first gate runner 70 has a first end portion 70a, a second end portion 70b opposite to the first end portion 70a and a first connecting portion 70c connecting the first end portion 70a and the second end portion 70b. The first end portion 70a is directly connected to the common gate contact 60 and a longitudinal main axis MA1 of each first gate runner 70 is extending in a lateral direction away from the common gate contact 60. Specifically, the longitudinal main axis MA1 of each first gate runner 70 extends from the circular, ring-shaped common gate contact 60 in a radial direction inwards towards a lateral center C of the semiconductor wafer 110. The second end portion 70b of each first gate runner 70 is directly connected to the second gate electrode layer 171. The first gate runners 70 are laterally arranged with rotational symmetry as shown in FIG. 2A.

At least the first connecting portion 70c of each first gate runner 70 is separated from the first gate electrode layer 161, so that any electrically conducting path from the first connecting portion 70c of each first gate runner 70 to the first gate electrode layer 161 passes at least through one of the first end portion 70a of the same first gate runner 70, the second end portion 70b of the same first gate runner 70 and the semiconductor wafer 110. In the top view of FIG. 2A black lines along the two lateral sides of each first gate runner 70 show the separation of the first gate runner 70 from the first gate electrode layer 161. Gaps on two opposing lateral sides of the first gate runners 70 between the first gate electrode layer 161 and the first connecting portion 70c of each first gate runner 70 are indicated as first separation lines 95a in FIG. 2B.

The second gate electrode layer 171 comprises a first ring-shaped gate electrode layer portion 171b, which is laterally surrounding the remaining portion of the second gate electrode layer 171. Each first gate runner 70 connects the common gate contact 60 with this first ring-shaped electrode layer portion 171b. Any point in the second gate electrode layer 171 is electrically connected to the first ring-shaped electrode layer portion 171b by an electrical path inside of the second gate electrode layer 171. That means that any second gate electrode layer portion 171a of the second thyristor cells 52 is directly electrically connected to the first ring-shaped gate electrode layer portion 171b.

Exemplarily each one of the first gate electrode layer 161, the second gate electrode layer 171, the common gate contact 60 and the first gate runners 70 comprises a metal material such as aluminum.

The first gate runners 70 have a length in radial direction that is at least two or at least three times a maximal length of the first emitter layer portions 154a of any first thyristor cell 51. Accordingly the first gate runners 70 traverse plural rings of the first emitter layer portions 154a in a top view.

As indicated and shown in FIG. 2C the first emitter layer portions 154a of all thyristor cells 51, 52 belong to a first emitter layer 154, the first base layer portions 155a are portions of a continuous first base layer 155, the second base layer portions 159a are portions of a continuous second base layer 159, the drift layer portions 156a are portions of a continuous drift layer 156, the buffer layer portions 157a are portions of a continuous buffer layer 157, the second emitter layer portions 158a are portions of a continuous emitter layer 158 and the second main electrode layer portions 163a are portions of a continuous second main electrode layer 163. That means that the first emitter layer 154, the first base layer 155, the second base layer 159, the drift layer 156, the buffer layer 157, the second emitter layer 158 and the second main electrode layer 163 may be shared by the first and second thyristor cells 51, 52.

A thickness d2 of each first gate runner 70 in a direction perpendicular to the lateral direction (i.e., in a direction perpendicular to the second main side 112) may be the same or may alternatively be at least 25% or at least 50% higher than a thickness d1 of the first gate electrode layer 161 at a position in the middle between two adjacent first emitter layer portions 154a.

In the following a turn-off power semiconductor device 200 according to a second embodiment will be discussed with reference to FIG. 3 which shows the turn-off power semiconductor device 200 in cross-section. Due to the many similarities between the turn-off power semiconductor device 100 according to the first embodiment and the turn-off power semiconductor device 200 according to the second embodiment only differences between the second embodiment and the first embodiment will be discussed in the following, whereas it is referred to the above discussion of the first embodiment with regard to all remaining features.

Figure 3:
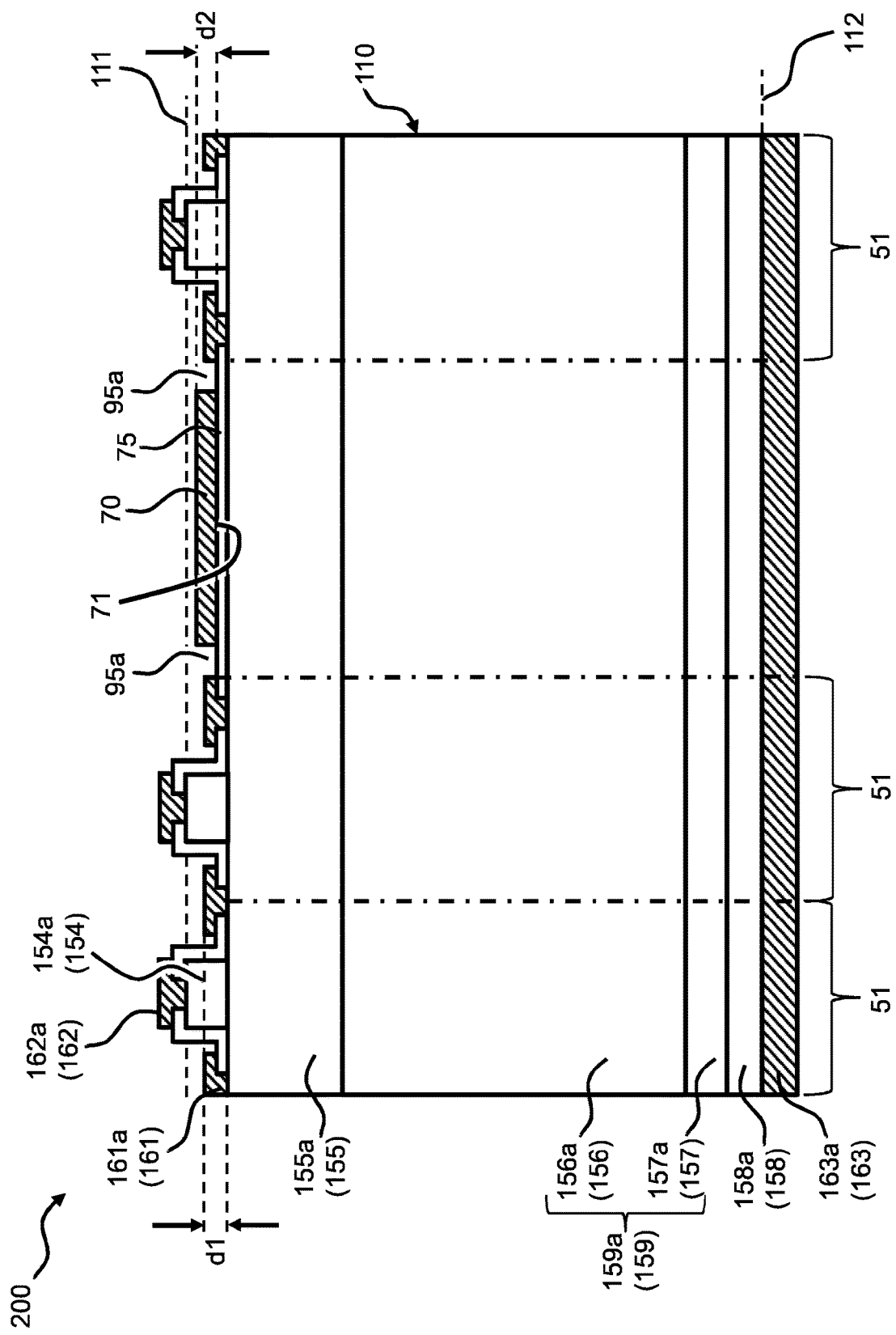
FIG. 3 shows a cross-section of a turn-off power semiconductor device according to a second embodiment (which does as such not fall under the scope of the claims, but serves for a better understanding of certain aspects of the claimed invention)

In particular, if reference signs used in FIG. 3 are identical to reference signs used in any one of FIGS. 2A to 2D, then they refer to same elements having the same features and characteristics as in the first embodiment. The top view of the turn-off power semiconductor device 200 is the same as the top view of the turn-off power semiconductor device 100 as shown in FIG. 2A. The cross-section shown in FIG. 3 is a cross section along line I-I' in FIG. 2B. The only difference between the first and the second embodiment is that in the second embodiment the first gate runners 70 are respectively separated and electrically insulated from the semiconductor wafer 110 by an insulating layer 75 interposed between each first gate runner 70 and the semiconductor wafer 110.

Exemplarily, the insulating layer 75 is interposed between a bottom 71 of each first gate runner 70 and the first base layer 155. As in the first embodiment a thickness d2 of each first gate runner 70 in a direction perpendicular to the lateral direction (i.e., in a direction perpendicular to the second main side 112) may be the same or may alternatively be at least 25% or at least 50% higher than a thickness d1 of the first gate electrode layer 161 at a position in the middle between two adjacent first emitter layer portions 154a.

In the following a turn-off power semiconductor device 300 according to a third embodiment is discussed with reference to FIG. 4 which shows a section of a top view of the turn-off power semiconductor device 300. Due to the many similarities between the turn-off power semiconductor device 300 of the third embodiment and the turn-off power semiconductor device 100 according to the first embodiment, only differences between the third embodiment and the first embodiment are discussed in the following, whereas it is referred to the discussion of the first embodiment above with regard to all remaining features.

Figure 4:
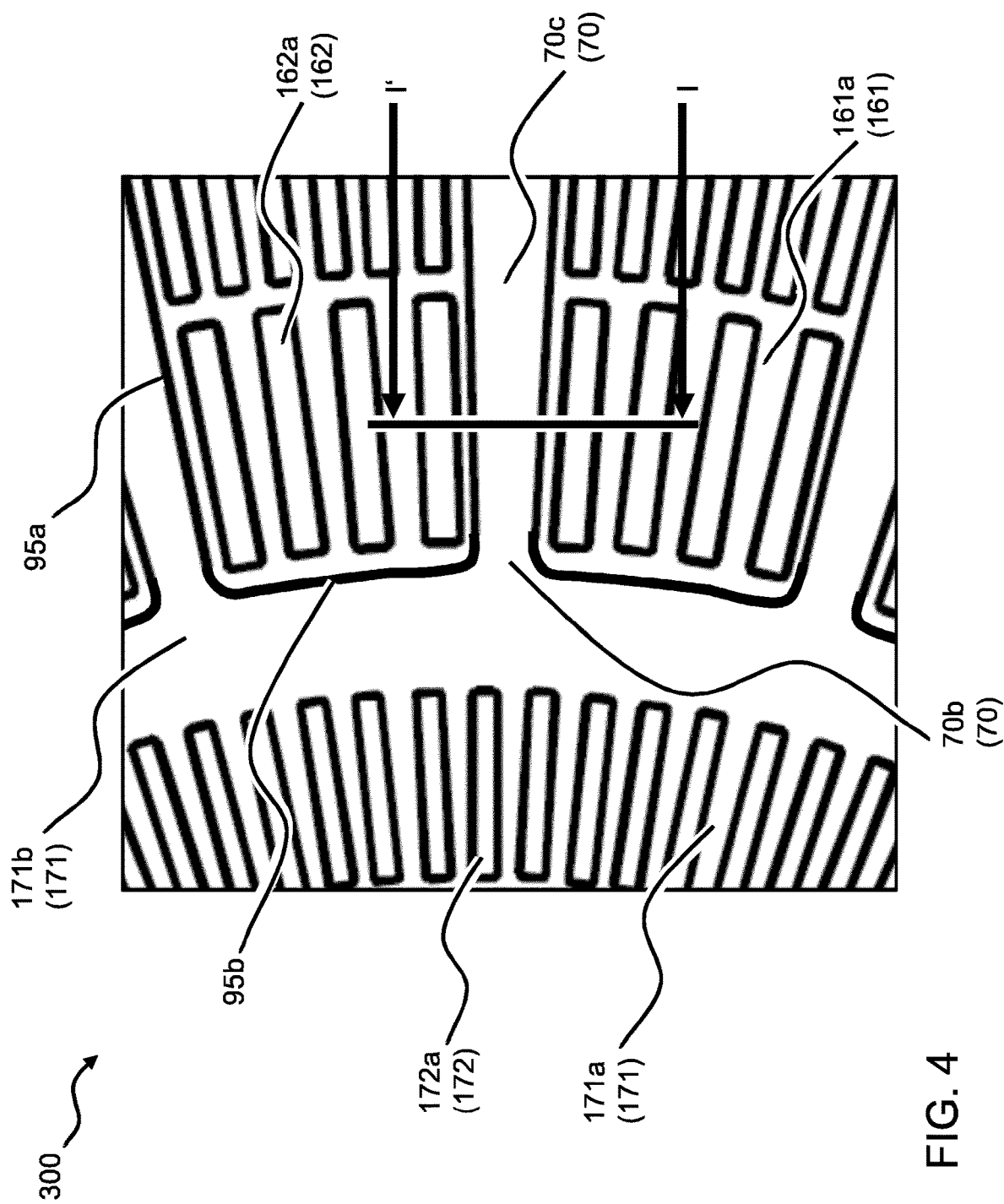
FIG. 4 shows a section of a top view of a turn-off power semiconductor device according to a third embodiment.

In particular, reference signs in FIG. 4 which are identical to reference signs used in anyone of FIGS. 2A to 2D refer to same elements having the same features and the same characteristics as described above for the first embodiment. A cross section of the turn-off power semiconductor device 300 along a line I-I' in FIG. 4 is identical to the cross section shown in FIG. 2B above. The only difference between the first embodiment and the third embodiment is that in the turn-off power semiconductor device 300 the first ring-shaped gate electrode layer portion 171b of the second gate electrode layer 171 is separated from the first gate electrode layer 161 in a radial direction. A gap between the first ring-shaped gate electrode layer portion 171b and the first gate electrode layer 161 is indicated by a second separation line 95b shown in FIG. 4. The second separation line 95b connects two adjacent first separation lines 95a so that two adjacent first separation lines 95a and the connecting second separation line 95b form a single continues separation line. In a direction perpendicular to the second separation line 95b there is no direct contact between the second gate electrode layer 171 and the first gate electrode layer 161. As a result a gate current from the second thyristor cells 52 is prevented from flowing into the first gate electrode layer 161 and is forced to flow through the first gate runners 70 towards the common gate contact 60.

In the following a turn-off power semiconductor device 400 according to a fourth embodiment is described with reference to FIGS. 5A to 5D. Again, due to many similarities between the turn-off power semiconductor device 100 according to the first embodiment and the turn-off power semiconductor device 400 according to the fourth embodiment, only differences between the first embodiment and the fourth embodiment are described in the following. With regard to all other features it is referred to the above description of the first embodiment. In particular reference signs in FIGS. 5A to 5D which are identical to reference signs used in FIGS. 2A to 2D refer to same elements having same features and characteristics as discussed above.

Figure 5A:
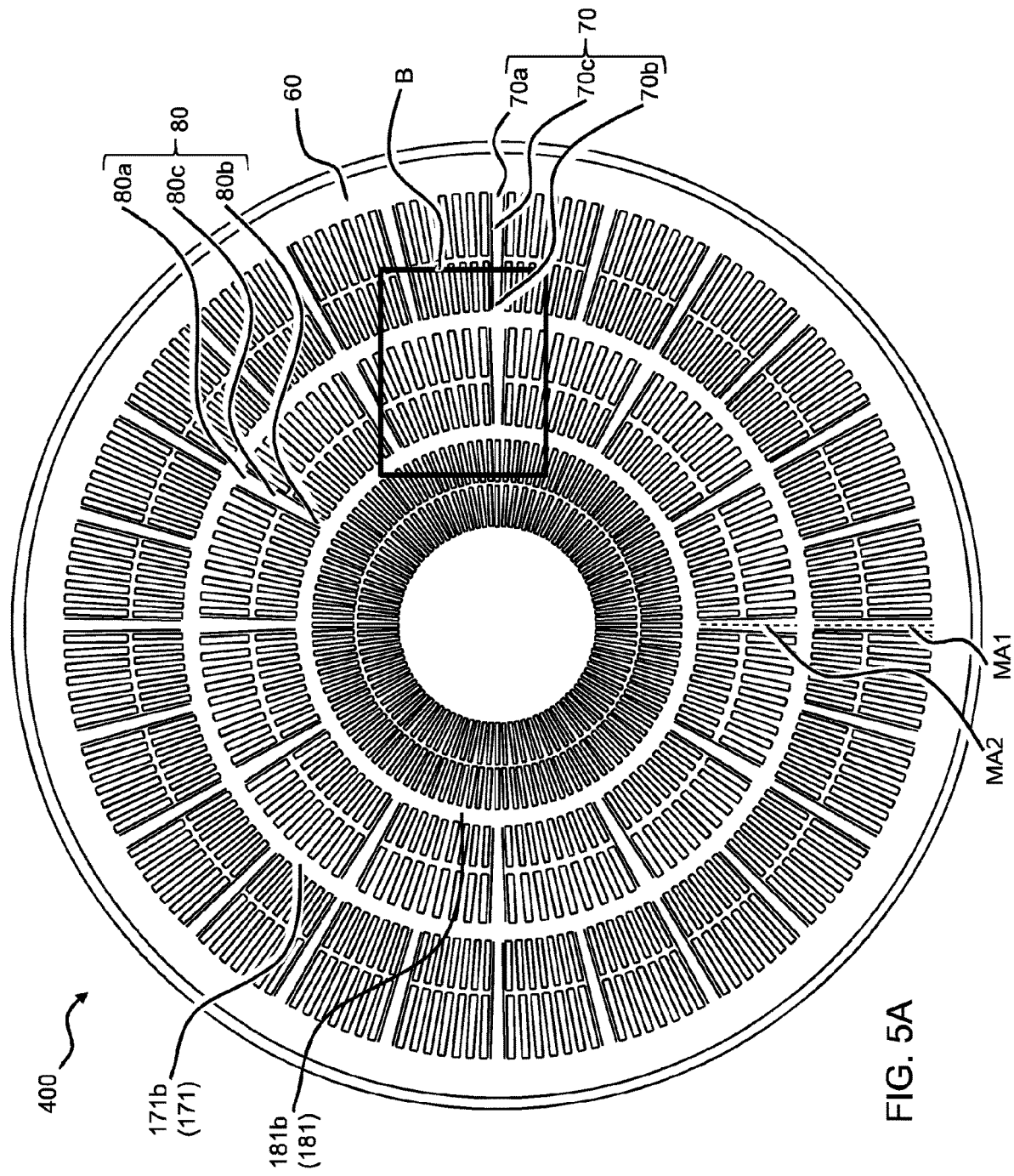
FIG. 5A shows a top view of a turn-off power semiconductor device according to a fourth embodiment (which does as such not fall under the scope of the claims, but serves for a better understanding of certain aspects of the claimed invention)
Figure 5B:
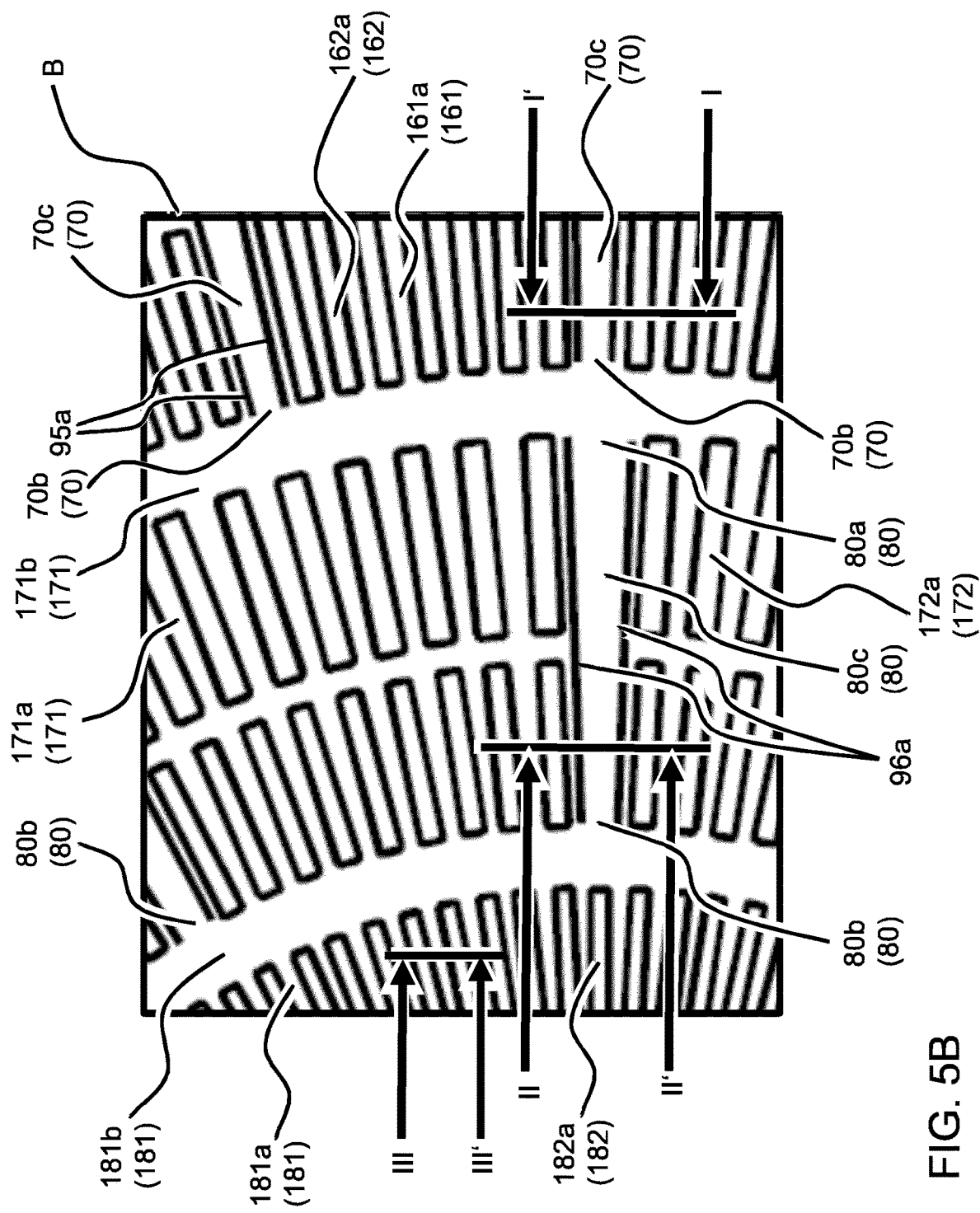
FIG. 5B shows an enlarged view of section B in FIG. 5A.

FIG. 5A shows a top view of the turn-off power semiconductor device 400. FIG. 5B shows an enlarged view of section B in FIG. 5A. First thyristor cells 51 are arranged in the two outermost concentric rings and first gate runners 70 traverse these two concentric rings in a radial direction. The first end portion 70a of each first gate runner 70 is connected to the common gate contact 60 and the second end portion 70b of each first gate runner 70 is connected to the first ring-shaped gate electrode layer portion 171b of the second gate electrode layer 171 as in the first embodiment. Different from the first embodiment, the first thyristor cells 51 in the fourth embodiment are arranged in only two concentric rings, whereas in the first embodiment the first thyristor cells 51 are arranged in three outermost concentric rings.

Second thyristor cells 52 in the fourth embodiment are arranged in two intermediate concentric rings. Second gate runners 80 traverse the two concentric rings of second thyristor cells 52 in a radial direction from the first ring-shaped gate electrode layer portion 171b to a second ring-shaped gate electrode layer portion 181b of a third gate electrode layer 181 discussed below. Each second gate runner 80 has, similar to the first gate runners 70, a third end portion 80a, a fourth end portion 80b opposite to the third end portion 80a and a second connecting portion 80c connecting the third end portion 80a and the fourth end portion 80b.

Figure 5C:
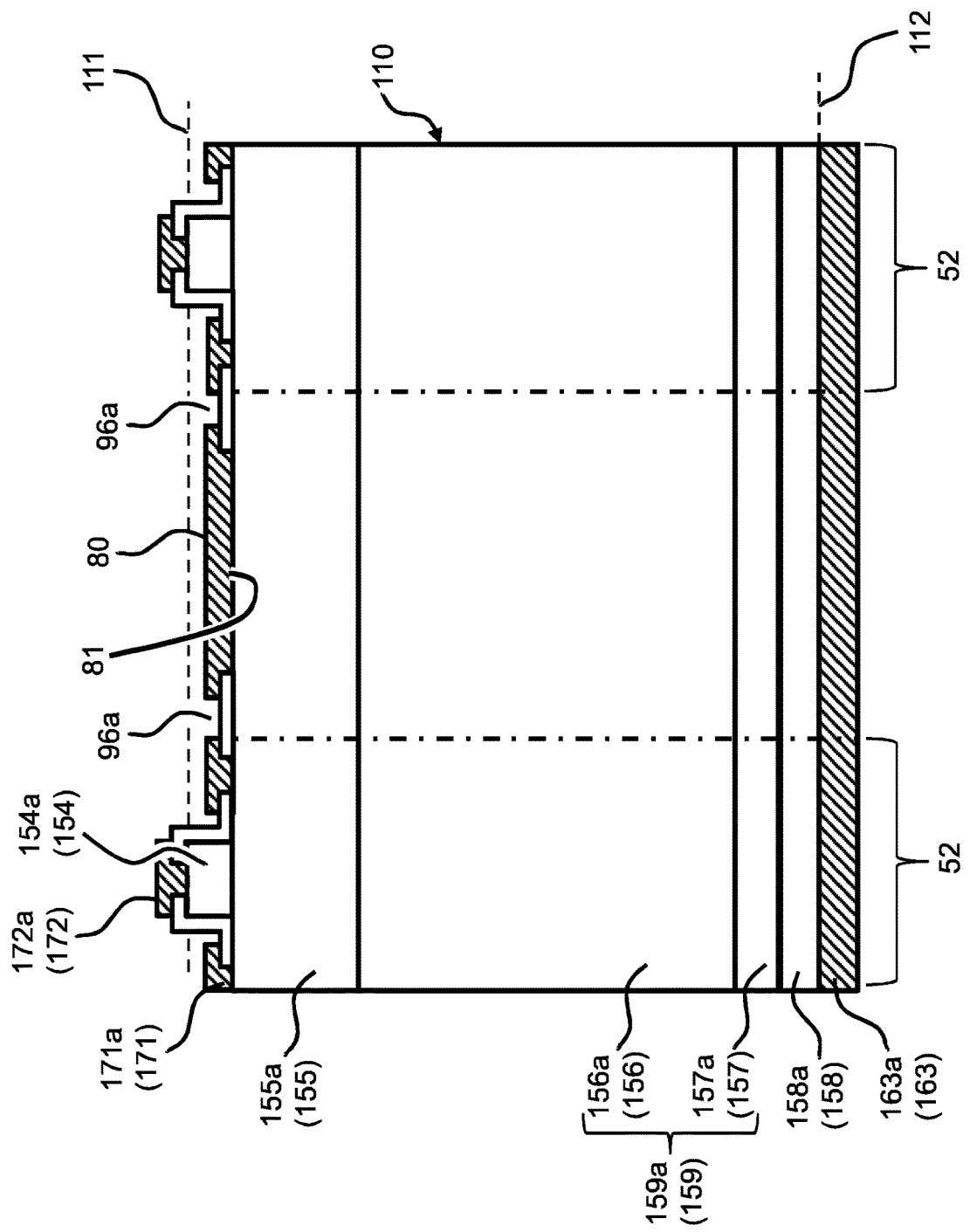
FIG. 5C shows a cross-section of the turn-off power semiconductor device according to the fourth embodiment along a line II-II' in FIG. 5B.

The third end portion 80a of each second gate runner 80 is connected to the first ring-shaped electrode layer portion 171b and the fourth end portion 80b of each second gate runner 80 is connected to the second ring-shaped electrode layer portion 181b. At least the second connecting portion 80c of each second gate runner 80 is separated from the second gate electrode layer 171 so that any electrically conducting path from the second connecting portion 80c of each second gate runner 80 to the second gate electrode layer 171 passes at least through one of the third end portion 80a of the same second gate runner 80, the fourth end portion 80b of the same second gate runner 80 and the semiconductor wafer 110. Gaps between the second connecting portion 80c and the second gate electrode layer 171 along two lateral sides of the connection portion 80c are indicated as third separation lines 96a in FIG. 5B. In FIG. 5C there is shown a cross-section along a line II-II' in FIG. 5B. Two second thyristor cells 52 and a gate runner 80 laterally interposed between these two second thyristor cells 52 can be seen in cross-section in FIG. 5C.

Figure 5D:
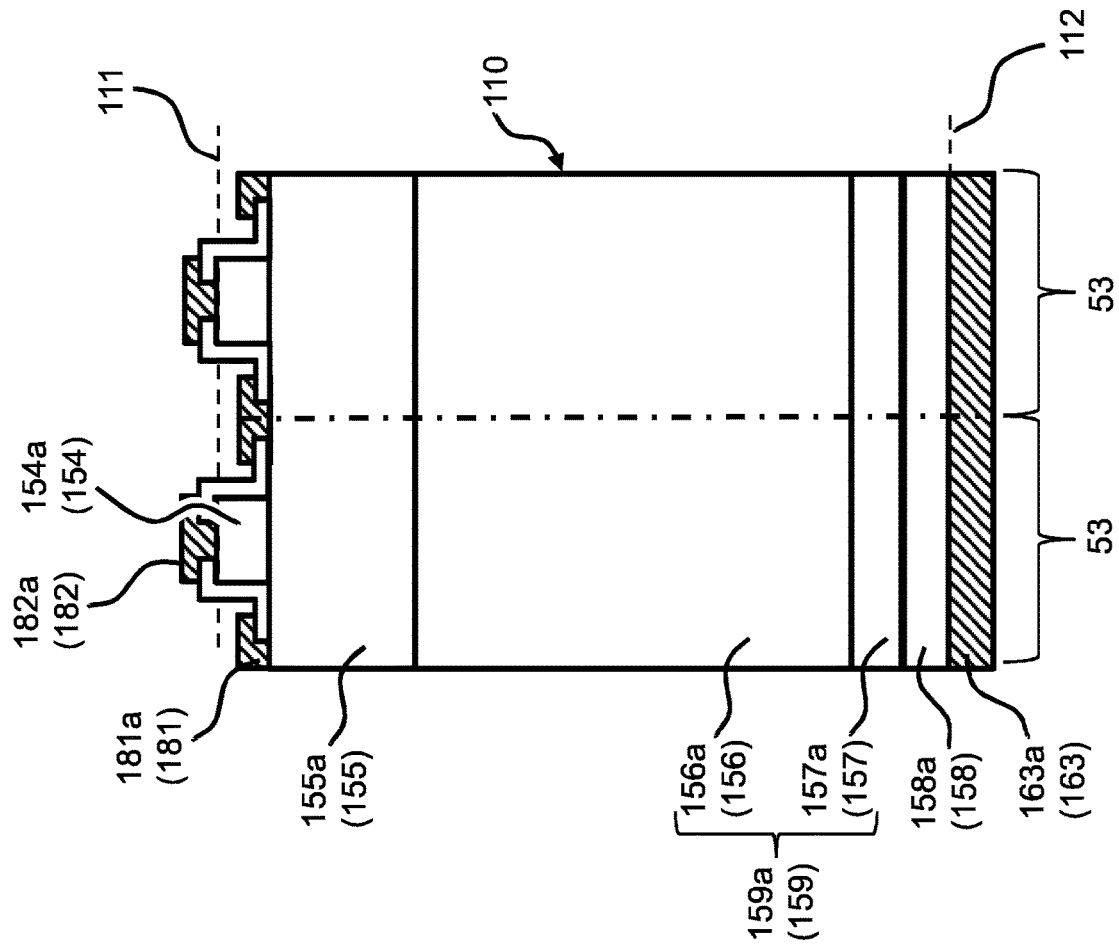
FIG. 5D shows a cross-section of the turn-off power semiconductor device according to the fourth embodiment along a line III-III' in FIG. 5B.

Third thyristor cells 53 are laterally arranged in two innermost concentric rings. A cross-section of two adjacent third thyristor cells 53 along a line III-III' in FIG. 5B is shown in FIG. 5D. Except that the third thyristor cells 53 are arranged in two innermost concentric rings, whereas the second thyristor cells 52 in the first embodiment are arranged in three innermost concentric rings, the lateral arrangement and the structure of the third thyristor cells 53 in the fourth embodiment is the same as the lateral arrangement and structure of second thyristor cells 52 in the first embodiment. The stripe-shaped first emitter layer portions 154*a* of the third thyristor cells 53 are laterally surrounded by the third gate electrode layer 181 which includes third gate electrode layer portions 181*a* of all third thyristor cells 53.

Similar to the first ring-shaped gate electrode layer portion 171*b*, the second ring-shaped gate electrode layer portion 181*b* surrounds a remaining portion of the third gate electrode layer 181. The second gate runners 80 have a similar structure as the first gate runners 70. The only difference is that the second gate runners 80 are not directly connected to the common gate contact 60 at its third end portion 80*a*, respectively, but are connected to the first ring-shaped gate electrode layer portion 171*b*. As can be seen best from FIG. 5A, the number of first gate runners 70 is higher than the number of second gate runners 80. Each second gate runner 80 has a longitudinal main axis MA2 which is aligned to the longitudinal main axis MA1 of one of the first gate runners 70. In this manner pairs of a first gate runner 70 and of a second gate runner 80, respectively, form linear electrically conductive paths to connect the common gate contact 60 to the second ring-shaped gate electrode layer portion 181*b*.

Figure 6:
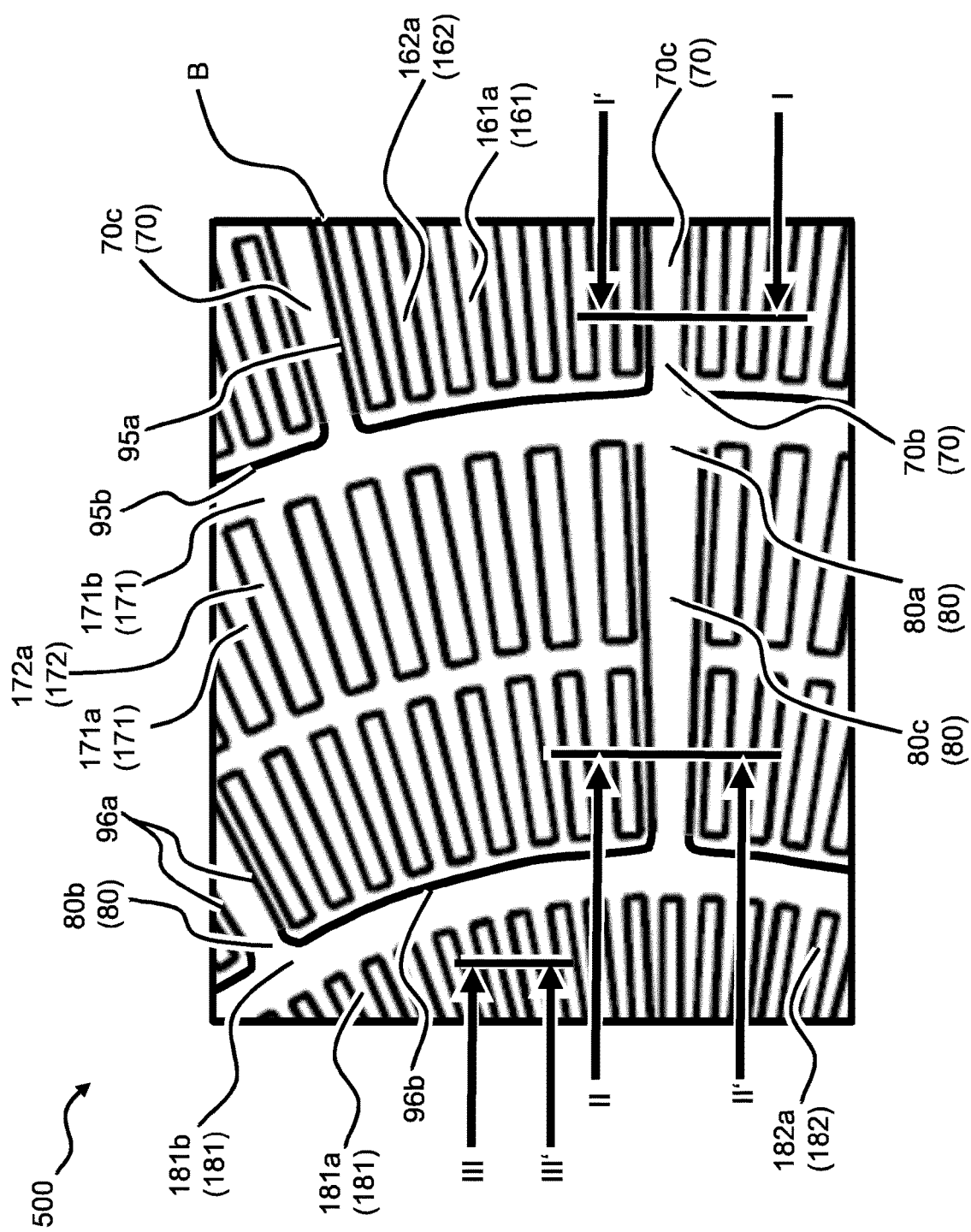
FIG. 6 shows a section of a top view of a turn-off power semiconductor device according to a fifth embodiment.

In the following a turn-off power semiconductor device 500 according to a fifth embodiment will be described with reference to FIG. 6. Due to many similarities between turn-off power semiconductor device 500 according to the fifth embodiment and the turn-off power semiconductor devices 300 and 400 according to the third and fourth embodiment only differences between these embodiments will be described in the following. FIG. 6 shows a section B of the top view of the turn-off power semiconductor device 500, which corresponds to the top view shown in FIG. 5A. The device 500 of the fifth embodiment differs from that of the fourth embodiment in that the second gate electrode layer 171 is separated from the first gate electrode layer 161 in a radial direction as in the third embodiment shown in FIG. 4. A gap between the first ring-shaped gate electrode layer portion 171*b* and the first gate electrode layer 161 is indicated by a second separation line 95*b* in FIG. 6. The second separation line 95*b* connects two adjacent first separation lines 95*a* as in the third embodiment. In a direction perpendicular to the second separation line 95*b* there is no direct contact between the second gate electrode layer 171 and the first gate electrode layer 161. As a result a gate current from the second thyristor cells 52 is prevented from flowing into the first gate electrode layer 161 and is forced to flow through the first gate runners 70 towards the common gate contact 60. Likewise, the third gate electrode layer 181 is separated from the second gate electrode layer 171 in a radial direction. A gap between the second ring-shaped gate electrode layer portion 181*b* and the second gate electrode layer 171 is indicated by a fourth separation line 96*b*.

Figure 7:
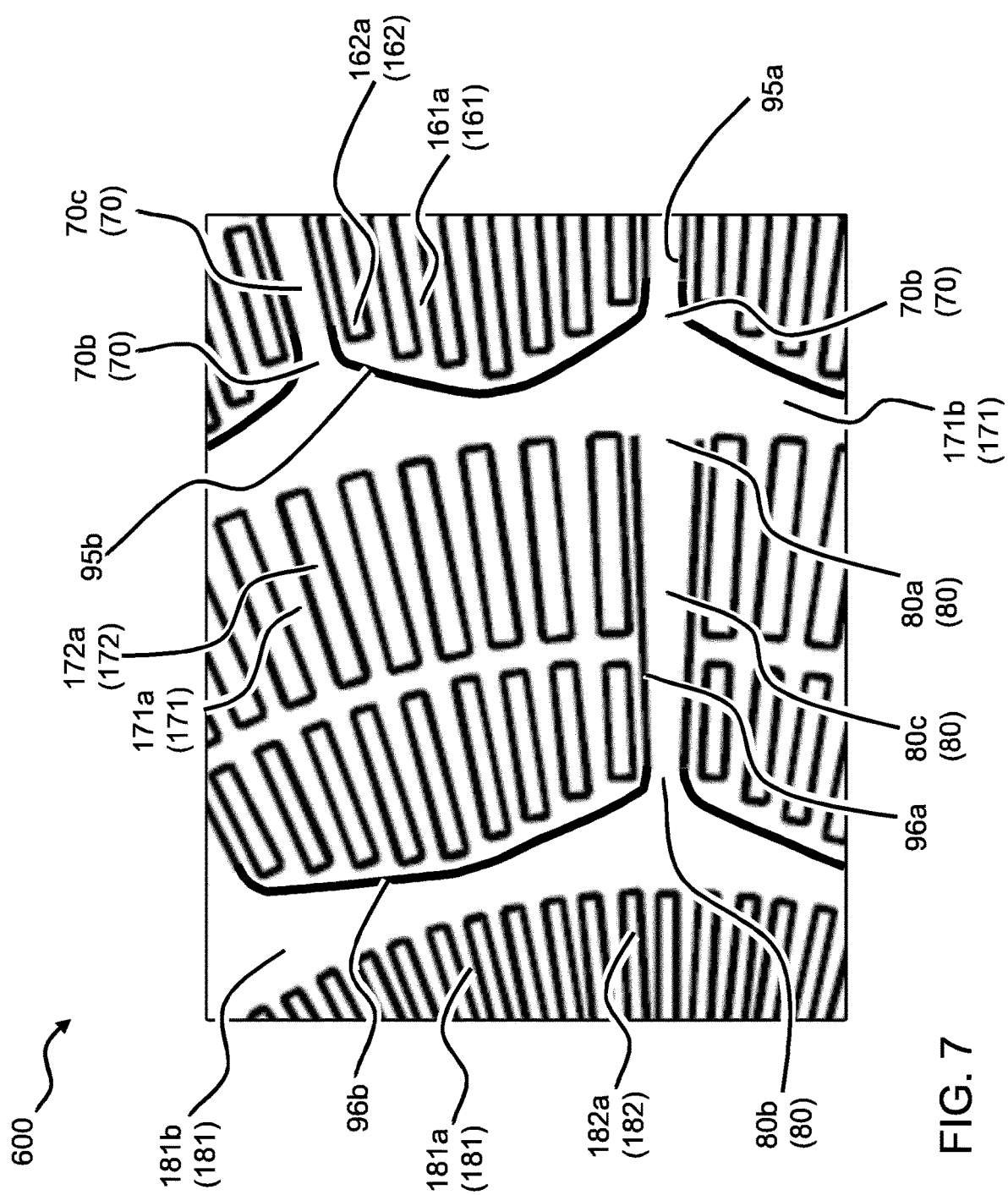
FIG. 7 shows a section of a top view of a turn-off power semiconductor device according to a sixth embodiment.

In the following a turn-off power semiconductor device 600 according to a sixth embodiment is described with reference to FIG. 7. The sixth embodiment differs from the fifth embodiment only in that the innermost ring of first thyristor cells 51 has first emitter layer portions 154*a* and corresponding first main electrode layer portions 162*a*, in which a length of the first emitter layer portions 154*a* varies as a function of a distance to the next first gate runner 70 along a circular direction (perpendicular to the radial direction), such that any first emitter layer portion 154*a* adjacent to any one of the first gate runners 70 has a shorter length than all other first emitter portions in this innermost ring which are not adjacent to one of the first gate runners 70 in the circular direction. In particular, in the embodiment shown in FIG. 7, in the innermost ring, the length of the first emitter layer portions 154*a* increases continuously with increasing distance from the next first gate runner 70 such that a distance of the first emitter layer portions 154*a* in the innermost ring to the respective next first emitter layer portion 154*a* of a second thyristor cell 52 increases with increasing distance to the next first gate runner 70. In this manner a radial width of the first ring-shaped gate electrode layer portion 171*b* varies and increases along a circumferential direction towards the first gate runners 70, i.e., the radial width of the first ring-shaped gate electrode layer portion 171*b* is larger the closer the circumferential position is to the next first gate runner 70. The same variation of the length of the first emitter layer portions 154*a* applies to the innermost ring of second thyristor cells 52.

It will be apparent for persons skilled in the art that modifications of the above described embodiments are possible without departing from the idea of the invention as defined by the appended claims.

The above embodiments were explained with specific conductivity types. The conductivity types of the semiconductor layers in the above described embodiments might be switched, so that for any embodiment all layers which were described as p-type layers would be n-type layers and all layers which were described as n-type layers would be p-type layers.

In the above described embodiments the turn-off power semiconductor device may be a reverse conducting turn-off power semiconductor device, i.e., it may comprise a freewheeling diode integrated in the semiconductor wafer.

The above described turn-off power semiconductor devices were described to comprise a drift layer 156 and a buffer layer 157. However, the turn-off power semiconductor device does not necessarily comprise a buffer layer.

The above described turn-off power semiconductor devices were described with specific arrangement of first, second and third thyristor cells 51, 52 and 53 in plural concentric rings. However, the thyristor cells may be arranged in another way. Exemplarily, the number of rings in which the first to third thyristors cells are arranged may be different from the number of rings shown in the figures.

In the above described embodiments the common gate contact 60 is arranged to extend along the circumferential edge of the semiconductor wafer 110. However, the common gate contact 60 may have another shape. Also it may be arranged at another position such as in the lateral center region of the semiconductor wafer or as a ring-shaped region laterally interposed between thyristor cells outside of the ring-shaped region and thyristor cells inside of the ring-shaped region.

In the sixth embodiment the innermost rings of both, of the first thyristor cells 51 and of the second thyristor cells 52 were described to have a varying length of the first emitter layer portions 154*a*. However, in a modified embodiment only the innermost ring of the first emitter cells 51 or of the second emitter cells 52 may have a variation of the length of first emitter layer portions 154.

In the above described embodiments, first separation lines 95*a* were described as a gap in a lateral direction. However, the separation between the first connection portion 70*c* and the first gate electrode layer 161 may also be implemented without such gap by an insulating layer interposed between the first gate electrode layer 161 and the first connecting portion 70c. The same applies with regard to electrical separation between the first ring-shaped gate electrode layer portion 171b and the first gate electrode layer 161 described above with the second separation line 95b, with regard to the electrical separation between the second connecting portion 80c and the second gate electrode layer 171 described above with the third separation line 96a, and with regard to the electrical separation between the second ring-shaped gate electrode layer portion 181b and the second gate electrode layer 171 described above with the fourth separation line 96b.

The turn-off power semiconductor devices 400, 400 and 500 were described with two different groups of thyristor cells, namely the first thyristor cells 51 and the second thyristor cells 52, which are traversed by different number of gate runners 70 and 80, respectively. However, there may exist further groups of thyristor cells which are traversed by additional gate runners.

It should be noted that the term "comprising" does not exclude other elements or steps and that the indefinite article "a" or "an" does not exclude the plural. Also elements described in association with different embodiments may be combined.

LIST OF REFERENCE SIGNS 1 reverse conducting IGCT (RC-IGCT)
2 thyristor cell
3 integrated free-wheeling diode
10, 110 wafer
11, 111 first main side
12, 112 second main side
20 gate electrode
21 first cathode electrode
22 cathode semiconductor layer portion
23 base semiconductor layer
24 drift semiconductor layer
25 buffer semiconductor layer
26 first anode semiconductor layer
27 first anode electrode
31 second anode electrode
32 second anode semiconductor layer
33 second cathode semiconductor layer
34 second cathode electrode
40 common gate contact
51 first thyristor cell
52 second thyristor cell
53 third thyristor cell
60 common gate contact
70 first gate runner
71 bottom (of first gate runner 70)
70a first end portion (of first gate runner 70)
70b second end portion (of first gate runner 70)
70c first connecting portion (of first gate runner 70)
80 second gate runner
80a third end portion (of first gate runner 80)
80b fourth end portion (of first gate runner 80)
80c second connecting portion (of first gate runner 80)
95a first separation line
95b second separation line
96a third separation line
96b fourth separation line
100, 200, 300, 400, 500, 600 turn-off power semiconductor device
154a first emitter layer portion
154 first emitter layer
155a first base layer portion
155 first base layer
156a drift layer portion
156 drift layer
157a buffer layer portion
157 buffer layer
158a second emitter layer portion
158 second emitter layer
159a second base layer portion
159 second base layer
161a first gate electrode layer portion
161 first gate electrode layer
162a, 172a, 182a first main electrode layer portion
163a second main electrode layer portion
163 second main electrode layer
171 second gate electrode layer
171a second gate electrode layer portion
171b first ring-shaped gate electrode portion
181 third gate electrode layer
181a third gate electrode layer portion
181b second ring-shaped gate electrode layer portion
182 first main electrode
A, B section
C lateral center (of semiconductor wafer 110)
d1, d2 thickness
MA1, MA2 longitudinal main axis

The invention claimed is:

1. A turn-off power semiconductor device comprising:
a semiconductor wafer having a first main side and a second main side opposite to the first main side;
a plurality of thyristor cells;
a common gate contact arranged on the first main side; and
a plurality of stripe-shaped electrically conductive first gate runners, each first gate runner having a first end portion, a second end portion opposite to the first end portion and a first connecting portion connecting the first end portion and the second end portion, wherein the first end portion is directly connected to the common gate contact and a longitudinal main axis of each first gate runner extends in a lateral direction away from the common gate contact;
wherein each thyristor cell comprises in an order from the first main side to the second main side:
a first emitter layer portion of a first conductivity type;
a first base layer portion of a second conductivity type different from the first conductivity type, the first emitter layer portion being in direct contact with the first base layer portion to form a first p-n junction between the first base layer portion and the first emitter layer portion;
a second base layer portion of the first conductivity type, wherein the first base layer portion is in direct contact with the second base layer portion to form a second p-n junction between the first base layer portion and the second base layer portion; and
a second emitter layer portion of the second conductivity type separated from the first base layer portion by the second base layer portion, wherein the second base layer portion is in direct contact with the second emitter layer portion to form a third p-n junction between the second base layer portion and the second emitter layer portion, a first gate electrode layer portion arranged lateral to the first emitter layer portion, the first gate electrode layer portion forming an ohmic contact with the first base layer portion;

a first main electrode layer portion arranged on the first main side and forming an ohmic contact with the first emitter layer portion; and a second main electrode layer portion arranged on the second main side and forming an ohmic contact with the second emitter layer portion;

wherein the plurality of thyristor cells comprises a plurality of first thyristor cells and a plurality of second thyristor cells;

wherein the first emitter layer portion of each first thyristor cell has a distance from the common gate contact that is smaller than a predetermined distance and the first emitter layer portion of each second thyristor cell has a distance from the common gate contact that is larger than the predetermined distance;

wherein the first gate electrode layer portions of all first thyristor cells are implemented as a first gate electrode layer laterally surrounding the first main electrode layer portions of all first thyristor cells;

wherein the first gate electrode layer portions of all second thyristor cells are implemented as a second gate electrode layer;

wherein the first gate electrode layer is directly connected to the common gate contact such that the first gate electrode layer portion of each first thyristor cell is electrically connected to the common gate contact;

wherein the second end portion of each first gate runner is directly connected to the second gate electrode layer;

wherein the common gate contact is ring-shaped in an orthogonal projection onto a plane parallel to the second main side and the longitudinal main axis of each first gate runner extends in a radial direction from the common gate contact towards a lateral center of the semiconductor wafer;

wherein, in the orthogonal projection onto the plane parallel to the second main side, a first ring-shaped gate electrode layer portion of the second gate electrode layer is arranged inside the ring-shaped common gate contact to laterally surround a remaining portion of the second gate electrode layer, wherein each first gate runner connects the common gate contact with the first ring-shaped electrode layer portion;

wherein at least the first connecting portion of each first gate runner is separated from the first gate electrode layer, so that any electrically conducting path from the first connecting portion of the each first gate runner to the first gate electrode layer passes at least through one of the first end portion of a same first gate runner, a second end portion of the same first gate runner and the semiconductor wafer; and wherein an outer circumferential edge of the first ring-shaped gate electrode layer portion is separated from the first gate electrode layer so that any electrically conducting path from the second gate electrode layer passes at least through the semiconductor wafer or through one of the plurality of first gate runners.

2. The turn-off power semiconductor device according to claim 1, wherein the first gate electrode layer, the second gate electrode layer, the common gate contact and the plurality of first gate runners each comprise a metal material.

3. The turn-off power semiconductor device according to claim 1, wherein, in the orthogonal projection onto the plane parallel to the second main side, the semiconductor wafer has a circular shape, the first emitter layer portions of the plurality of thyristor cells are stripe-shaped and are arranged in concentric rings with a longitudinal main axis of the stripe-shaped first emitter layer portions respectively extending along a radial direction extending from the lateral center of the semiconductor wafer, wherein in each ring all first emitter layer portions have a same distance from the common gate contact.

4. The turn-off power semiconductor device according to claim 3, wherein, in an innermost ring of first thyristor cells, a length of the first emitter layer portions varies as a function of a distance to next first gate runner, such that any first emitter layer portion adjacent to any one of the plurality of first gate runners has a shorter length than all other first emitter portions in the innermost ring that are not adjacent to one of the plurality of first gate runners.

5. The turn-off power semiconductor device according to claim 1, wherein a length of each first gate runner in a radial direction is at least two times a maximal length of the first emitter layer portions of any first thyristor cell.

6. The turn-off power semiconductor device according to claim 5, wherein the length of each first gate runner in the radial direction is at least three times the maximal length of the first emitter layer portions of any first thyristor cell.

7. The turn-off power semiconductor device according to claim 5, wherein in the innermost ring of first thyristor cells the length of the first emitter layer portions increases with increasing distance from next first gate runner such that a distance of the first emitter layer portions in the innermost ring to the respective next first emitter layer portion of a second thyristor cell increases with increasing distance to the next first gate runner.

8. The turn-off power semiconductor device according to claim 1, wherein a thickness of each first gate runner in a direction perpendicular to the lateral direction is at least 25% greater than a thickness of the first gate electrode layer at a position in a middle between two adjacent first emitter layer portions, wherein a thickness direction is a direction perpendicular to the second main side.

9. The turn-off power semiconductor device according to claim 8, wherein the thickness of each first gate runner in a direction perpendicular to the lateral direction is at least 50% greater than the thickness of the first gate electrode layer at the position in the middle between two adjacent first emitter layer portions.

10. The turn-off power semiconductor device according to claim 1, wherein each first gate runner is separated and electrically insulated from the semiconductor wafer by an insulating layer interposed between the plurality of first gate runners and the semiconductor wafer.

11. The turn-off power semiconductor device according to claim 1, wherein the turn-off power semiconductor device further comprises a plurality of stripe-shaped electrically conductive second gate runners, wherein the plurality of first gate runners or the plurality of second gate runners are laterally arranged with rotational symmetry.

12. The turn-off power semiconductor device according to claim 1, wherein the turn-off power semiconductor device further comprises a plurality of stripe-shaped electrically conductive second gate runners, wherein the plurality of first gate runners and the plurality of second gate runners are laterally arranged with rotational symmetry.

13. A turn-off power semiconductor device comprising:
a semiconductor wafer having a first main side and a second main side opposite to the first main side;
a plurality of thyristor cells;

a common gate contact arranged on the first main side; and
a plurality of stripe-shaped electrically conductive first gate runners, each first gate runner having a first end portion, a second end portion opposite to the first end portion and a first connecting portion connecting the first end portion and the second end portion, wherein the first end portion is directly connected to the common gate contact and a longitudinal main axis of each first gate runner extends in a lateral direction away from the common gate contact;
wherein each thyristor cell comprises in an order from the first main side to the second main side:
a first emitter layer portion of a first conductivity type;
a first base layer portion of a second conductivity type different from the first conductivity type, the first emitter layer portion being in direct contact with the first base layer portion to form a first p-n junction between the first base layer portion and the first emitter layer portion;
a second base layer portion of the first conductivity type, wherein the first base layer portion is in direct contact with the second base layer portion to form a second p-n junction between the first base layer portion and the second base layer portion; and
a second emitter layer portion of the second conductivity type separated from the first base layer portion by the second base layer portion, wherein the second base layer portion is in direct contact with the second emitter layer portion to form a third p-n junction between the second base layer portion and the second emitter layer portion,
a first gate electrode layer portion arranged lateral to the first emitter layer portion, the first gate electrode layer portion forming an ohmic contact with the first base layer portion;
a first main electrode layer portion arranged on the first main side and forming an ohmic contact with the first emitter layer portion; and
a second main electrode layer portion arranged on the second main side and forming an ohmic contact with the second emitter layer portion;
wherein the plurality of thyristor cells comprises a plurality of first thyristor cells and a plurality of second thyristor cells;
wherein the first emitter layer portion of each first thyristor cell has a distance from the common gate contact that is smaller than a predetermined distance and the first emitter layer portion of each second thyristor cell has a distance from the common gate contact that is larger than the predetermined distance;
wherein the first gate electrode layer portions of all first thyristor cells are implemented as a first gate electrode layer laterally surrounding the first main electrode layer portions of all first thyristor cells;
wherein the first gate electrode layer portions of all second thyristor cells are implemented as a second gate electrode layer;
wherein the first gate electrode layer is directly connected to the common gate contact such that the first gate electrode layer portion of each first thyristor cell is electrically connected to the common gate contact;
wherein the second end portion of each first gate runner is directly connected to the second gate electrode layer;
wherein a length of each first gate runner in a radial direction is at least two times a maximal length of the first emitter layer portions of any first thyristor cell;
wherein a thickness of each first gate runner in a direction perpendicular to the lateral direction is at least 25% greater than a thickness of the first gate electrode layer at a position in a middle between two adjacent first emitter layer portions, wherein a thickness direction is a direction perpendicular to the second main side;
wherein the common gate contact is ring-shaped in an orthogonal projection onto a plane parallel to the second main side and the longitudinal main axis of each first gate runner extends in a radial direction from the common gate contact towards a lateral center of the semiconductor wafer;
wherein, in the orthogonal projection onto the plane parallel to the second main side, a first ring-shaped gate electrode layer portion of the second gate electrode layer is arranged inside the ring-shaped common gate contact to laterally surround a remaining portion of the second gate electrode layer, wherein each first gate runner connects the common gate contact with the first ring-shaped electrode layer portion;
wherein at least the first connecting portion of each first gate runner is separated from the first gate electrode layer, so that any electrically conducting path from the first connecting portion of the each first gate runner to the first gate electrode layer passes at least through one of the first end portion of a same first gate runner, the second end portion of the same first gate runner and the semiconductor wafer; and
wherein an outer circumferential edge of the first ring-shaped gate electrode layer portion is separated from the first gate electrode layer so that any electrically conducting path from the second gate electrode layer passes at least through the semiconductor wafer or through one of the plurality of first gate runners.

14. The turn-off power semiconductor device according to claim 13, wherein, in the orthogonal projection onto the plane parallel to the second main side, the semiconductor wafer has a circular shape, the first emitter layer portions of the plurality of thyristor cells are stripe-shaped and are arranged in concentric rings with a longitudinal main axis of the stripe-shaped first emitter layer portions respectively extending along a radial direction extending from the lateral center of the semiconductor wafer, wherein in each ring all first emitter layer portions have a same distance from the common gate contact.

15. The turn-off power semiconductor device according to claim 14, wherein, in an innermost ring of first thyristor cells, a length of the first emitter layer portions varies as a function of a distance to next first gate runner, such that any first emitter layer portion adjacent to any one of the plurality of first gate runners has a shorter length than all other first emitter portions in the innermost ring that are not adjacent to one of the first gate runners.

16. The turn-off power semiconductor device according to claim 13, wherein in the innermost ring of first thyristor cells the length of the first emitter layer portions increases with increasing distance from the next first gate runner such that a distance of the first emitter layer portions in the innermost ring to the respective next first emitter layer portion of a second thyristor cell increases with increasing distance to next first gate runner.

17. The turn-off power semiconductor device according to claim 13, wherein the turn-off power semiconductor device further comprises a plurality of stripe-shaped electrically conductive second gate runners, wherein the plurality of first gate runners or the plurality of second gate runners are laterally arranged with rotational symmetry.

18. A turn-off power semiconductor device comprising:
a semiconductor wafer having a first main side and a second main side opposite to the first main side;
a plurality of thyristor cells;
a common gate contact arranged on the first main side; and
a plurality of stripe-shaped electrically conductive first gate runners, each first gate runner having a first end portion, a second end portion opposite to the first end portion and a first connecting portion connecting the first end portion and the second end portion, wherein the first end portion is directly connected to the common gate contact and a longitudinal main axis of each first gate runner extends in a lateral direction away from the common gate contact;
wherein each thyristor cell comprises in an order from the first main side to the second main side:
  a first emitter layer portion of a first conductivity type;
  a first base layer portion of a second conductivity type different from the first conductivity type, the first emitter layer portion being in direct contact with the first base layer portion to form a first p-n junction between the first base layer portion and the first emitter layer portion;
  a second base layer portion of the first conductivity type, wherein the first base layer portion is in direct contact with the second base layer portion to form a second p-n junction between the first base layer portion and the second base layer portion; and
  a second emitter layer portion of the second conductivity type separated from the first base layer portion by the second base layer portion, wherein the second base layer portion is in direct contact with the second emitter layer portion to form a third p-n junction between the second base layer portion and the second emitter layer portion,
  a first gate electrode layer portion arranged lateral to the first emitter layer portion, the first gate electrode layer portion forming an ohmic contact with the first base layer portion;
  a first main electrode layer portion arranged on the first main side and forming an ohmic contact with the first emitter layer portion; and
  a second main electrode layer portion arranged on the second main side and forming an ohmic contact with the second emitter layer portion;
wherein the plurality of thyristor cells comprises a plurality of first thyristor cells and a plurality of second thyristor cells;
wherein the first emitter layer portion of each first thyristor cell has a distance from the common gate contact that is smaller than a predetermined distance and the first emitter layer portion of each second thyristor cell has a distance from the common gate contact that is larger than the predetermined distance;
wherein the first gate electrode layer portions of all first thyristor cells are implemented as a first gate electrode layer laterally surrounding the first main electrode layer portions of all first thyristor cells;
wherein the first gate electrode layer portions of all second thyristor cells are implemented as a second gate electrode layer;
wherein the first gate electrode layer is directly connected to the common gate contact such that the first gate electrode layer portion of each first thyristor cell is electrically connected to the common gate contact;
wherein the second end portion of each first gate runner is directly connected to the second gate electrode layer;
wherein the common gate contact is ring-shaped in an orthogonal projection onto a plane parallel to the second main side and the longitudinal main axis of each first gate runner extends in a radial direction from the common gate contact towards a lateral center of the semiconductor wafer;
wherein, in the orthogonal projection onto the plane parallel to the second main side, a first ring-shaped gate electrode layer portion of the second gate electrode layer is arranged inside the ring-shaped common gate contact to laterally surround a remaining portion of the second gate electrode layer, wherein each first gate runner connects the common gate contact with the first ring-shaped electrode layer portion;
wherein at least the first connecting portion of each first gate runner is separated from the first gate electrode layer, so that any electrically conducting path from the first connecting portion of the each first gate runner to the first gate electrode layer passes at least through one of the first end portion of a same first gate runner, the second end portion of the same first gate runner and the semiconductor wafer;
wherein an outer circumferential edge of the first ring-shaped gate electrode layer portion is separated from the first gate electrode layer so that any electrically conducting path from the second gate electrode layer passes at least through the semiconductor wafer or through one of the plurality of first gate runners;
wherein the plurality of thyristor cells further comprises a plurality of third thyristor cells, wherein the first emitter layer portion of each third thyristor cell has a distance from the common gate contact that is greater than a distance of each one of the first emitter layer portions of the first thyristor cells and of the second thyristor cells from the common gate contact;
wherein third gate electrode layer portions of all third thyristor cells are implemented as a third gate electrode layer;
wherein a second ring-shaped gate electrode layer portion of the third gate electrode layer is arranged inside of the ring-shaped common gate contact to laterally surround a remaining portion of the third gate electrode layer;
wherein the first gate electrode layer and the second gate electrode layer are arranged outside of the second ring-shaped gate electrode layer portion;
wherein the turn-off power semiconductor device further comprises a plurality of stripe-shaped electrically conductive second gate runners, each second gate runner having a third end portion, a fourth end portion opposite to the third end portion and a second connecting portion connecting the third end portion and the fourth end portion;
wherein the third end portion of each second gate runner is connected to the first ring-shaped electrode layer portion and the fourth end portion of each second gate runner is connected to the second ring-shaped electrode layer portion; and
wherein at least the second connecting portion of each second gate runner is separated from the second gate electrode layer so that any electrically conducting path from the second connecting portion of each second gate runner to the second gate electrode layer passes at least through one of the third end portion of a same second gate runner, the fourth end portion of the same second gate runner and the semiconductor wafer.

19. The turn-off power semiconductor device according to claim 18, wherein a number of first gate runners is greater than a number of second gate runners.

20. The turn-off power semiconductor device according to claim 18, wherein a longitudinal main axis of each second gate runner is aligned with the longitudinal main axis of one of the plurality of first gate runners.

* * * * *